United States Patent
Inoue

(10) Patent No.: US 8,564,998 B2
(45) Date of Patent: *Oct. 22, 2013

(54) CONTENT ADDRESSABLE MEMORY

(75) Inventor: Kazunari Inoue, Tokyo (JP)

(73) Assignee: Renesas Electronic Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,017

(22) Filed: Apr. 27, 2012

(65) Prior Publication Data

US 2012/0215976 A1    Aug. 23, 2012

Related U.S. Application Data

(63) Continuation of application No. 13/023,529, filed on Feb. 8, 2011, now Pat. No. 8,284,582, which is a continuation of application No. 12/355,793, filed on Jan. 18, 2009, now Pat. No. 7,894,227.

(30) Foreign Application Priority Data

Feb. 13, 2008   (JP) .................... 2008-031971

(51) Int. Cl.
*G11C 15/00*    (2006.01)

(52) U.S. Cl.
USPC .............. 365/49.17; 365/49.1; 365/49.16; 365/49.18

(58) Field of Classification Search
USPC .............. 365/49.17, 49.1, 49.16, 49.18
See application file for complete search history.

(56) References Cited

U.S. PATENT DOCUMENTS

| | | |
|---|---|---|
| 6,339,539 B1 | 1/2002 | Gibson et al. |
| 6,442,090 B1 | 8/2002 | Ahmed et al. |
| 6,515,916 B2 | 2/2003 | Takarabe |
| 6,584,003 B1 | 6/2003 | Kim et al. |
| 6,700,809 B1 * | 3/2004 | Ng et al. ............. 365/49.1 |
| 6,738,283 B2 | 5/2004 | Kasai et al. |
| 7,162,572 B2 | 1/2007 | Somasundaram |

(Continued)

FOREIGN PATENT DOCUMENTS

| | | |
|---|---|---|
| JP | 2001-210081 A | 8/2001 |
| JP | 2003-123482 A | 4/2003 |

(Continued)

OTHER PUBLICATIONS

Office Action issued May 15, 2012, in Japanese Patent Application No. 2008-031971.
Haesung Hwang et al, "Efficient Management of Access Control List by Combining Prefix Expansion and Hardware Modification", Technical Report of IEICE, IN 2007-105, vol. 107, No. 378, pp. 37-42, Dec. 2007.

*Primary Examiner* — Pho M Luu
(74) *Attorney, Agent, or Firm* — Miles & Stockbridge P.C.

(57) ABSTRACT

Array area and power consumption are reduced in a content addressable memory. A comparator for performing a match determination and a size determination is provided commonly for plural entries each storing data to be retrieved. Each entry includes data storage cells for storing data and mask cells for storing mask bits. The number of mask cells is smaller than that of the data storage cells. Search data is transmitted to the comparator via a search data bus. One of the entries is selected according to a predetermined rule. The comparator decodes the mask bits, generates a mask instruction signal, and performs match comparison and size comparison between the search data and data to be retrieved which is stored in the selected entry.

4 Claims, 22 Drawing Sheets

(56) References Cited

U.S. PATENT DOCUMENTS

| | | |
|---|---|---|
| 7,193,877 B1 * | 3/2007 | Yelluru .................. 365/49.1 |
| 7,230,839 B2 | 6/2007 | Lysinger |
| 7,251,707 B1 * | 7/2007 | Pereira .................. 711/108 |
| 7,350,137 B2 | 3/2008 | Foss et al. |
| 7,382,637 B1 * | 6/2008 | Rathnavelu et al. ....... 365/49.17 |
| 7,852,653 B2 | 12/2010 | Wickeraad et al. |
| 7,894,227 B2 * | 2/2011 | Inoue .................. 365/49.17 |
| 8,284,582 B2 * | 10/2012 | Inoue .................. 365/49.17 |

FOREIGN PATENT DOCUMENTS

| | | |
|---|---|---|
| JP | 2004-295967 A | 10/2004 |
| JP | 2005-129218 A | 5/2005 |
| JP | 2007-508653 T | 5/2007 |

* cited by examiner

|      | BL | /BL | SL | /SL | XOR |
|------|----|-----|----|-----|------|
| OUT0 | 0  | 1   | 0  | 1   | 0 : EQ |
| OUT1 | 0  | 1   | 1  | 0   | 1 : BL < SL |
| OUT2 | 1  | 0   | 0  | 1   | 1 : BL > SL |
| OUT3 | 1  | 0   | 1  | 0   | 0 : EQ |

EXAMPLE 2

0000 1010 0000 0001 0000 0001 0000 0001

0101 0101 0101 0101 0101 0101 0101 0101

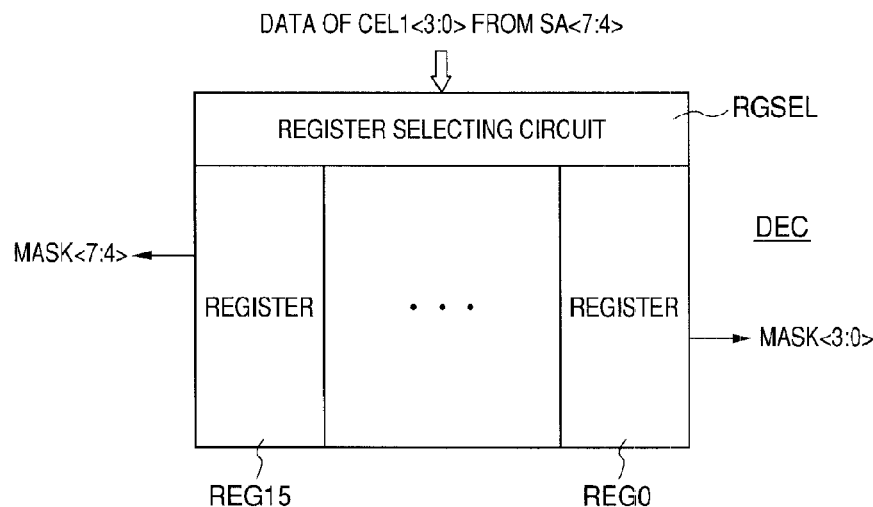

FIG. 20

| #N x DATA BITS | CONVENTIONAL ART | | | | PRESENT INVENTION | | | |
|---|---|---|---|---|---|---|---|---|
| | CEL0 | CEL1 | XOR | TOTAL | CEL0 | CEL1 | XOR | TOTAL |
| 64 ENTRIES x 64 BITS | 64 x 64 | 64 x 64 | 64 x 64 | 12,288 | 64 x 64 | 32 x 64 | 64 | 6,208 |
| 64 ENTRIES x 72 BITS | 64 x 72 | 64 x 72 | 64 x 72 | 13,824 | 64 x 72 | 32 x 72 | 72 | 6,984 |
| 256 ENTRIES x 64 BITS | 256 x 64 | 256 x 64 | 256 x 64 | 49,152 | 256 x 64 | 128 x 64 | 64 | 24,640 |
| 256 ENTRIES x 72 BITS | 256 x 72 | 256 x 72 | 256 x 72 | 55,296 | 256 x 72 | 128 x 72 | 72 | 27,720 |
| 256 ENTRIES x 80 BITS | 256 x 80 | 256 x 80 | 256 x 80 | 61,440 | 256 x 80 | 128 x 80 | 80 | 30,800 |
| 1M ENTRIES x 64 BITS | 1M x 64 | 1M x 64 | 1M x 64 | 192M | 1M x 64 | 512M x 64 | 64 | 96M |
| 1M ENTRIES x 72 BITS | 1M x 72 | 1M x 72 | 1M x 72 | 216M | 1M x 72 | 512M x 72 | 72 | 108M |
| 1M ENTRIES x 80 BITS | 1M x 80 | 1M x 80 | 1M x 80 | 240M | 1M x 80 | 512M x 80 | 80 | 120M |

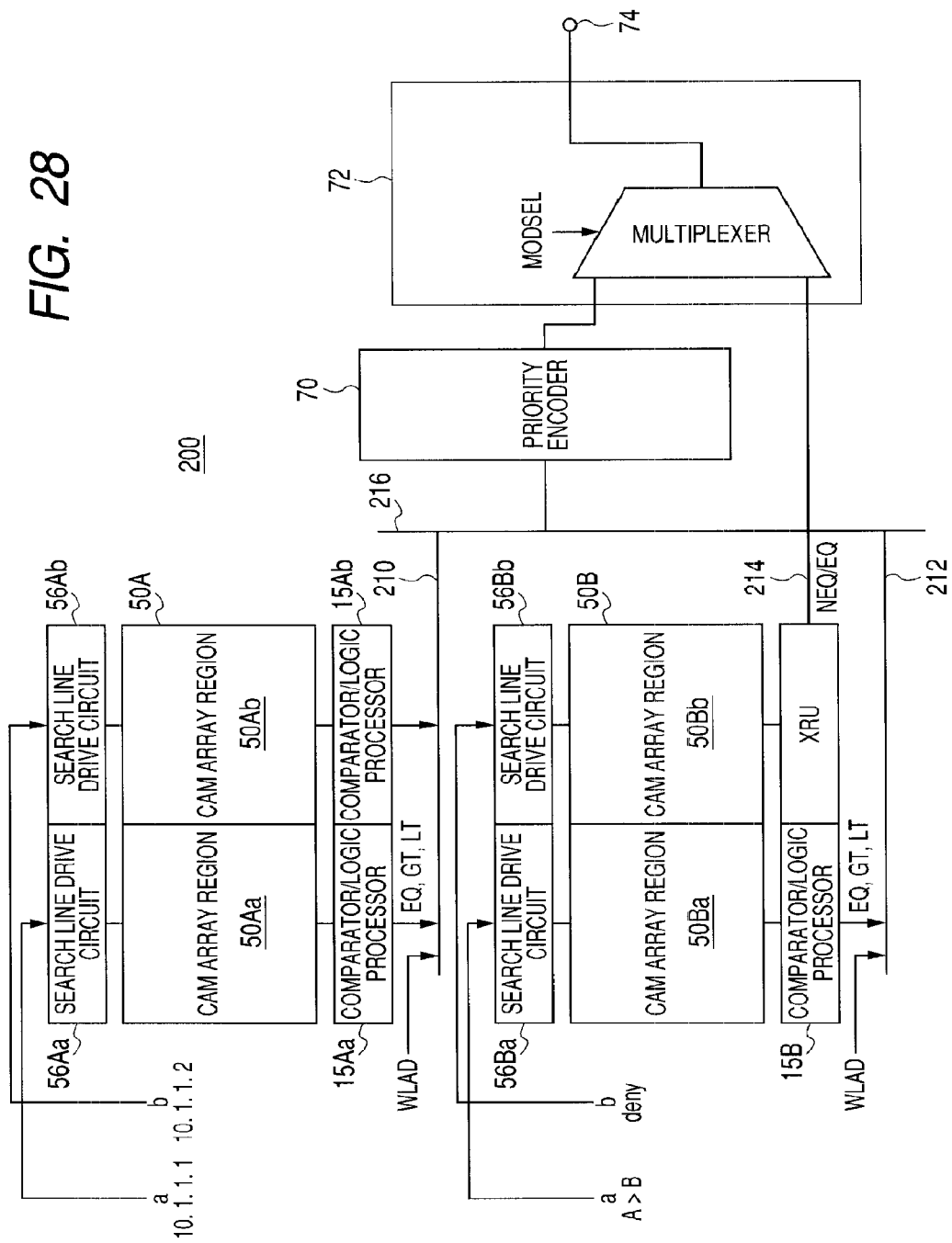

CONTENT ADDRESSABLE MEMORY

CROSS-REFERENCE TO RELATED APPLICATIONS

This application is a continuation of application Ser. No. 13/023,529 filed Feb. 8, 2011 (now U.S. Pat. No. 8,284,582), which is a continuation of application Ser. No. 12/355,793 filed Jan. 18, 2009 (now U.S. Pat. No. 7,894,227). Also, the disclosure of Japanese Patent Application No. 2008-31971 filed on Feb. 13, 2008 including the specification, drawings and abstract is incorporated herein by reference in its entirety.

BACKGROUND OF THE INVENTION

The present invention relates to a content addressable memory and, more particularly, to a hardware structure of a content addressable memory for reducing power consumption and occupation area.

In recent years, in network equipment such as a router and a switch, a content addressable memory (CAM) is widely used for search for a path of a network address or control of an access control list (ACL) of filtering. For example, in routing of a network address, the following process is executed. When a packet arrives at a router or a switch installed in the Internet environment, a network packet processing unit (NPU) in the router or switch analyzes the header of the arrived packet, and starts an address search to find the next hop destination (path). In the address search, the CAM is an LSI (Large Scale Integrated circuit) that provides the address search on the hardware base.

The destination network address written in the header of the packet is input as search request data for the next hop destination address search to the CAM. The CAM performs simultaneous parallel comparison between a list of data sequences of network addresses internally pre-stored and the input search request data. In the case where a matched address exists, the CAM outputs the index of the matched address. The NPU refers to the address of the next hop destination from the matched address index from the CAM. A concrete hop destination address is often written in another memory LSI such as an SRAM (Static Random Access Memory), not in the CAM itself.

On the other hand, in the case where there is no match with the data sequences stored in the CAM, the next hop destination address of the arrived packet is searched by a method different from the CAM hardware search. For example, when the addresses are not stored in the CAM but are written in another large-capacity memory, the large-capacity memory is accessed and a search on the software basis is performed. Alternatively, the packet is discarded as it is. Also in the case where no matched address exists in the CAM and long search time on the software basis is necessary, generally, the destination address (the next hop destination address) is written to the CAM and the storage data is updated as learning for the next packet having the same header. By the operation, a search of long process time by the software is performed only once. From the next time on, high-speed search on the CAM hardware basis can be performed. The advantage of the CAM in the application is increased.

The process performed in the case of the use for ACL control is similar to that in a search for a network address path. The ACL is an application which is frequently used nowadays in a router or a switch installed in a company or a school. By a combination of port numbers or the like indicative of the transmitter of a packet and the kind, discarding of the packet is controlled. The discarding control can be usually freely rewritten by the user (network administrator) by software. In the discarding control, by simultaneous parallel comparison between an input packet header and data written in the CAM by the user (network administrator), a search is executed at high speed on the hardware basis. According to the search result, an LSI different from the CAM is referred to. However, in the case of the ACL discharging control, different from the case of the address path search, a concrete process is often simply "permit:permission of passage of a packet" or "deny: discarding of a packet".

As described above, an advantage of an address search on the CAM hardware basis is high effective search performance. The search performance is constant irrespective of the size of a data sequence held (bit width). In the case of a search on the software basis using a general memory, various studies using a tree and the like have been reported. However, in the case of a search on the software basis, generally, the larger the held data amount becomes, the longer the time of loading all of data to the outside becomes. That is, in the case of using a general memory, there is a characteristic that time required for an address search increases in proportional to the capacity of a database. This is a big issue when considering increase in the population of the Internet in recent years. Therefore, the address search on the CAM hardware basis is highly evaluated for such a use of the packet transfer control also from the viewpoint that the search performance does not depend on the size of a database.

An example of the configuration of such a CAM is disposed in patent document 1 (Japanese patent laid-open No. 2003-123482). In the patent document 1, SRAM cells are applied as CAM cells and TCAM (Ternary CAM) cells. In the configuration shown in the patent document 1, each memory cell is provided with a match detecting circuit (XOR circuit), and match/mismatch between stored data bits and search data bits is determined on a bit unit basis.

A configuration of comparing the size of search data and that of data stored in a CAM is disclosed in patent document 2 (Japanese patent laid-open No. 2005-129218). In the configuration described in the patent document 2, as memory cells, data memory cells for storing data values and mask memory cells for storing mask values are provided. A size comparator for comparing the size of data stored in the data memory cell and that of input data is also provided. The size comparator receives a size instruction signal (carry) from a memory cell in the ante stage, effectively performs a subtracting process, and outputs a signal indicative of the result of the comparison (subtraction result) to the next stage.

A CAM having the function of performing match comparison and size comparison is disclosed in patent document 3 (Japanese patent laid-open No. 2004-295967). In the configuration described in the patent document 3, a size comparator and a match comparator are provided for each of CAM cells.

A configuration of determining match/mismatch of a tag address of a cache memory is disclosed in patent document 4 (Japanese patent laid-open No. 2001-210081). In the configuration shown in the patent document 4, information corresponding to a tag address is read from a tag storage in accordance with the tag address. An exclusive OR operation between the read information and an address signal given from an address bus is executed in a column selection gate, and the computation result is output to the sense amplifier. By providing the exclusive OR computing function of a column selection gate, the exclusive OR computation is executed on a weak read signal on a bit line in the tag storage to generate a hit/miss signal. Therefore, at a timing earlier than the logic computation at a CMOS level, the exclusive OR computation result is generated to retrieve a tag at high speed.

Patent document 1: Japanese patent laid-open No. 2003-123482
Patent document 2: Japanese patent laid-open No. 2005-129218
Patent document 3: Japanese patent laid-open No. 2004-295967
Patent document 4: Japanese patent laid-open No. 2001-210081

SUMMARY OF THE INVENTION

A CAM has drawbacks larger than those of other memory LSIs. First, a market price of a CAM is higher than those of the other memories. For example, the unit price per bit of a CAM is at least five times as high as that of an SRAM. The high cost is caused mainly by a hardware structure for realizing the characteristics of the CAM. Specifically, a circuit for detecting a match is provided in each of CAM cells. In the case of storing ternary information, a data bit and a mask bit are stored by using two SRAM cells. By the mask bits, the "don't care" state is realized. Consequently, the layout area of a CAM cell is larger than that of a single cell of an SRAM.

The patent document 1 discloses a configuration realizing a single SRAM cell by four transistors without providing a load transistor of the SRAM cell in order to reduce the cost of a CAM cell. However, also in the configuration disclosed in the patent document 1, a match detecting circuit (XOR circuit) is provided for each of memory cells. A CAM cell is constructed by two SRAM cells. The occupation area of the CAM cell or TCAM cell cannot be sufficiently reduced.

In a CAM or TCAM, at the time of performing match retrieval, a match line is charged/discharged. A match retrieval operation is executed simultaneously on the entries. Since the search line is charged/discharged and the match line is charged/discharged, in the case of executing an always search instruction at the operation frequency of 150 MHz in a CAM having a capacity of, for example, 18 Mbits, power consumption is 10 W or larger. The power consumption of 10 W or larger is not so large as compared with that of an LSI of today. However, the power consumption of the CAM is a factor of disturbing improvement of the performance. That is, to realize higher-speed operation, the power consumption has to be decreased at equivalent scaling. However, in the case of increasing the capacity of a CAM, due to the characteristics of the hardware configuration of the CAM cell, power consumption increases as the capacity increases.

In the case of retrieving a network address, a required process is only match comparison.

In the case of the access control list (ACL), however, not only the match comparison, but also processes such as size comparison and range designation are often requested. For example, when there is an ACL control process of discarding all of packets of No. 1,000 or larger as TCP (Transmission Control Protocol) port numbers, it is requested to perform the processes of range designation and size comparison.

The patent document 2 discloses the configuration of providing a size comparator for each of memory cells and transmitting a size comparison result in order of bit positions of the memory cells. In the patent document 2, a size comparator is provided for each of the memory cells, a data bit and a mask bit are used as storage data, and the size of an input value (search data) and that of the storage data are compared with each other. Consequently, there is a problem such that the occupation area of the TCAM cells is large. In the patent document 2, the configuration for reducing power consumption is not considered.

In the configuration disclosed in the patent document 3, a circuit for performing size comparison is provided for each of CAM cells. Consequently, when the number of cells increases, the layout area of the cells cannot be reduced. A match line and a size comparison line for match and size comparison are provided for each of entries, so that power consumption further increases.

In the configuration shown in the patent document 4, one entry is selected by a tag address in a tag storage having plural entries. It is therefore unnecessary to transfer search data to the entries in parallel. At the time of match determination, XOR computation is performed by a column selection gate by bit line pair (cell column). In the configuration shown in the patent document 4, only match/mismatch between storage data and input data is determined. The configuration of performing ternary determination is not described. A comparing function such as size comparison is not provided.

As described above, in a TCAM for performing the conventional ternary determination, the number of components of a unit cell is larger than that in an SRAM, and it causes increase in the cost. In the case of ternary determination, two memory cells, that is, a memory cell for storing a data bit and a memory cell for storing a mask bit are necessary, and a match detection circuit for comparison with search data has to be provided. In the case of providing the match detection circuit for each of unit cells, the cell occupation area ratio in a TCAM is usually at least three times as high as that of an SRAM. A CAM is further provided with a priority encoder or the like for determining match data to be selected in accordance with a certain priority in the case where plural pieces of match data exist. Consequently, the number of components in hardware further increases, and the market price per bit in a TCAM is at least five times as high as that of an SRAM.

A CAM is widely used also in network equipment such as a network switch and a core router having plural ports of the Fast Ethernet whose communication speed is 100 Mbps and gigabit Ethernet whose communication speed is some gigabits. The performance improvement in the network equipment is remarkable. The communication speed increases by about 10 times every three or four years like in the Fast Ethernet, gigabit Ethernet, and 10-gigabit Ethernet being developed in recent years. Naturally, the components of the network equipment are requested to increase the speed accompanying the pace of improvement in the performance of the network and increase in operation speed in hardware and software of the network equipment. The pace/speed of improvement is much higher than the performance improvement speed of a CPU according to the Moore's law that storage capacity of a memory circuit doubles every 1.5 to two years.

In particular, recently, employment of a CAM as hardware for search adapted to network equipment having a performance of 10 gigabits or higher is being questioned for the reasons of high power consumption and large cell occupation area. To mount a large-capacity memory, naturally, the bit price per unit cell in the memory has to be lowered (according to the Moore's law). To realize higher-speed operation, power consumption has to be also decreased at similar scaling. In the case of a CAM, because of the characteristics of the hardware configuration, there is tendency that as the capacity increases, the power consumption increases. That is, the tendency and the characteristic are quite opposite to the scaling desired by the user. The problems cannot be sufficiently solved by the configurations described in the patent documents. Therefore, to address a request for network equipment in future, a technical reform on the hardware structure of a CAM as hardware for search is in demand.

An object of the present invention is, therefore, to provide a content addressable memory performing searching operation at high speed without enlarging the layout area of a unit cell, having logic functions of size comparison, range determination, and the like, and operating with low consumption power.

In the content addressable memory of the present invention, an entry for storing data to be retrieved is constructed by data storage cells and mask cells for storing mask bits. The number of mask cells is smaller than that of the data storage cells. A comparing/logic processing circuit for performing match detection and size comparison is provided commonly for two or more predetermined number of entries. According to a predetermined characteristic of given search data, one entry is designated from the plural entries by a pre-search circuit. The data stored in the designated entry is supplied to a corresponding comparing/logic processing circuit.

In the content addressable memory of the present invention, the comparing/logic processing circuit is shared by plural entries. Therefore, as compared with the configuration in which a comparator or a size comparator is provided for each of the entries, the occupation area of the memory cells can be reduced. The number of mask cells for storing mask bits is smaller than that of the data storage cells for storing data bits. Thus, the number of memory cells constructing an entry can be reduced.

One of the plural entries sharing the comparing/logic processing circuit is selected by the pre-search circuit, and comparing processes such as match determination and size-relation determination are performed in the comparing/logic processing circuit. Therefore, as compared with the configuration in which the search operation is performed simultaneously in the plural entries, power consumption can be reduced. It is unnecessary to transmit the search data to plural entries in parallel, so that the search line charge/discharge current can be reduced. Thus, the content addressable memory of lower power consumption and having a reduced occupation area of memory cells can be realized.

BRIEF DESCRIPTION OF THE DRAWINGS

FIG. 15 is a diagram schematically showing an example of the configuration of a decoder in FIG. 14;

FIG. 16 is a diagram showing a list of decoding logics in a modification of the decoder in the first embodiment of the present invention;

FIG. 20 is a diagram showing comparison of the number of components of a CAM of the present invention and that of a conventional CAM;

FIG. 28 is a diagram schematically showing a general configuration of the CAM as the second embodiment of the present invention.

DETAILED DESCRIPTION OF THE PREFERRED EMBODIMENTS

First Embodiment

Figure 1:
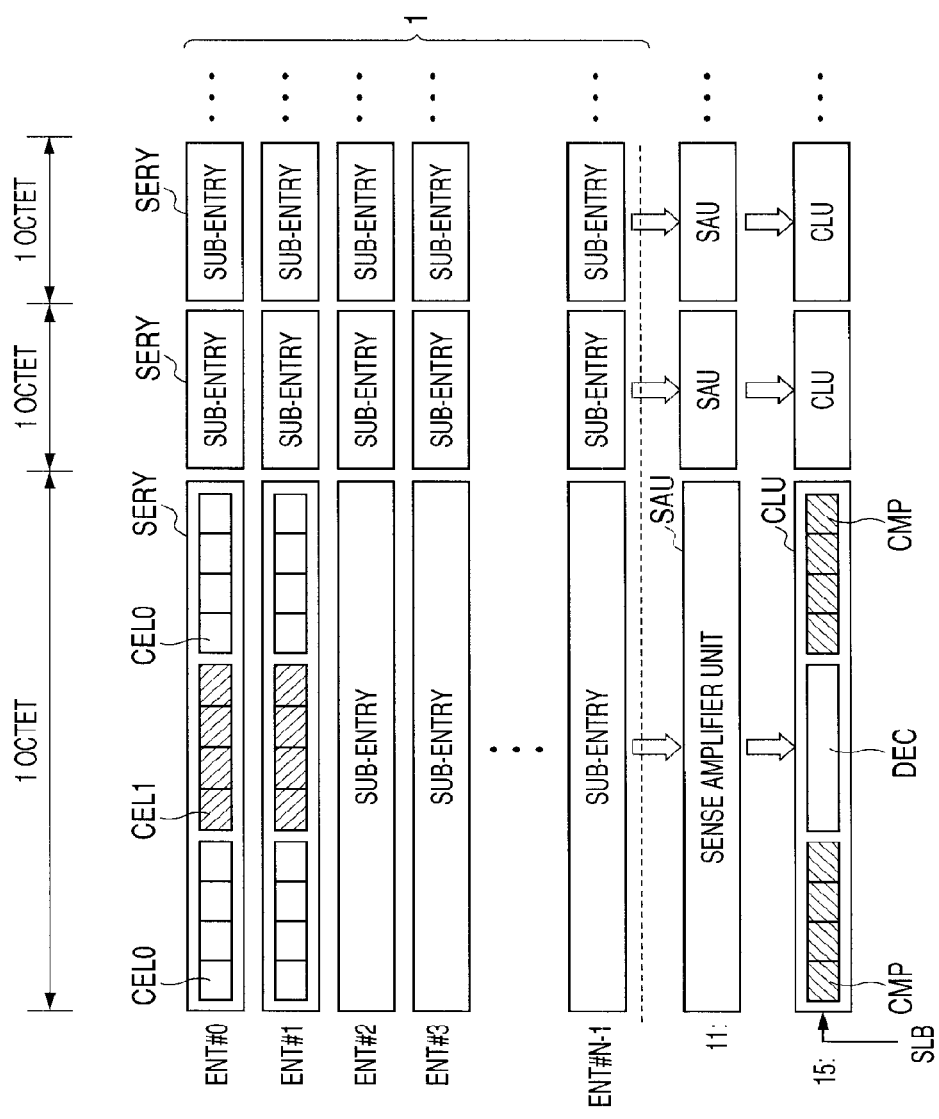
FIG. 1 is a diagram schematically showing the configuration of a main part of a CAM as a first embodiment of the invention.

FIG. 1 is a diagram schematically showing the configuration of a main part of a content addressable memory as a first embodiment of the present invention. In FIG. 1, a memory array 1 is divided into plural entries ENT#0 to ENT#N−1. Each of the entries ENT#0 to ENT#N−1 is divided into sub-entries SERY every plural bits (one octet (eight bits) in the embodiment). Each of the sub-entries SERY includes data storage cells CEL0 for storing information data corresponding to a bit sequence of search data and mask cells CEL1 for storing mask bits.

In the following description, data corresponding to search data will be called information data so as to be distinguished from mask data. In the following, in the case of simply calling "data", it refers to the information data.

In one sub-entry SERY, eight data storage cells CEL0 and four mask cells CEL1 are arranged. The data storage cell CEL0 simply stores an information bit of data to be searched, and a mask cell simply stores a mask bit. The data storage cell CEL0 and the mask cell CEL1 do not have a match detecting function. Therefore, the number of memory cells of the subentry SERY for storing one octet is 12 which is smaller than 16 bits of memory cells as unit cells of one octet in a normal TCAM, and the layout area is reduced.

To compare data stored in the entries ENT#0 to ENT#N−1 with search data, a sense amplifier unit 11 and a comparing/logic processing unit 15 are provided commonly for the entries ENT#0 to ENT#N−1.

The sense amplifier circuit 11 includes a sense amplifier unit SAU arranged in correspondence with the sub-entry. Although the configuration of the sense amplifier SAU will be specifically described later, the sense amplifier unit SAU includes sense amplifiers corresponding to the data storage cells and the mask cells.

The comparing/logic processing unit 15 includes a comparing/logic processing unit CLU. The comparing/logic processing unit CLU includes a comparator CMP for comparing information data stored in the data storage cells with search data and a decoder DEC for decoding the mask bits stored in the mask cells. The 4-bit mask data is expanded to an 8-bit mask instruction signal and is selectively masked for the comparing process in the comparing/logic processing unit CLU.

As shown in FIG. 1, by providing the sense amplifier circuit and the comparing/logic processing unit 15 commonly for the plural entries ENT#0 to ENT#N−1, as compared with the configuration of providing comparators (XOR circuits) for respective entries, the occupation area of the CAM (Content Addressable Memory) can be reduced.

The search data is transmitted to the comparing/logic processing unit 15 via a search data bus SLB. It is not requested to provide a search line for transmitting search data to plural entries. Therefore, current required to charge/discharge the search line can be reduced, and current consumption can be reduced. The comparing/logic process is performed in the comparing/logic processing unit 15, and the comparing process is not performed in an entry. Therefore, it is unnecessary to dispose a match line for each of entries, so that the amount of current required to charge/discharge the match line can be reduced.

The sub-entry SERY stores data of one octet for the reason that an application of performing a process such as IP address path retrieval is assumed in a network such as the Internet. It is sufficient to properly determine the bit width of the subentry SERY in accordance with a use to which the content addressable memory of the present invention is applied.

In the configuration shown in FIG. 1, one of the entries ENT#0 to ENT#N−1 is selected according to the characteristic of search data. After that, the information data and mask data stored in the selected entry is amplified by the sense amplifier circuit 11, and subjected to comparison and size determination in the comparing/logic processing unit.

Figure 2:
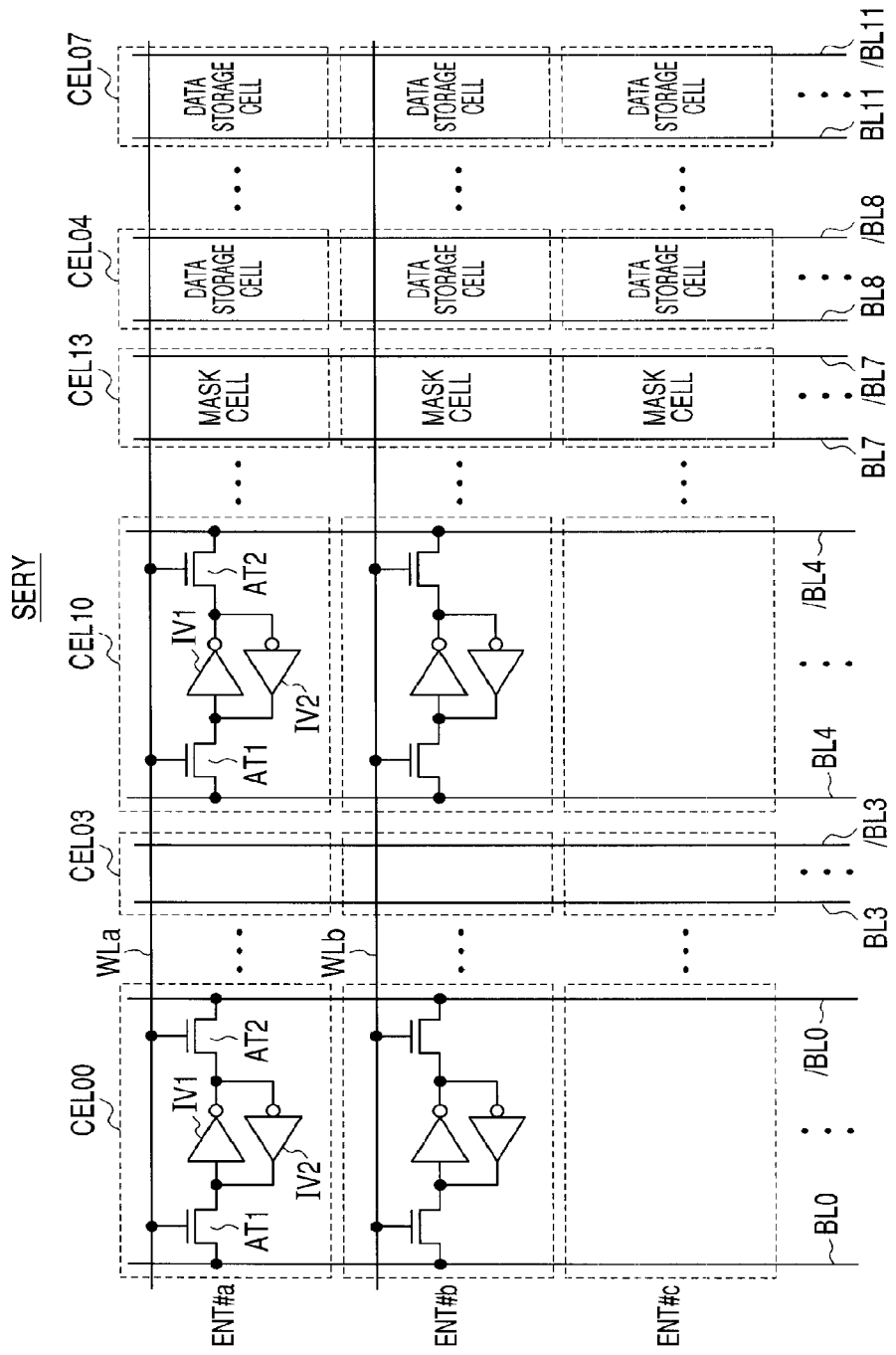
FIG. 2 is a diagram concretely showing the configuration of a memory array illustrated in FIG. 1.

FIG. 2 is a diagram showing a concrete configuration of the sub-entry SERY in FIG. 1. In FIG. 2, the configurations of entries ENT#a, ENT#b, and ENT#c are representatively shown. In FIG. 2, memory cells are arranged in a matrix. Word lines WL are disposed in correspondence with memory cell rows, and pairs of bit lines BL and /BL are disposed in correspondence with memory cell columns. One word line is disposed commonly for memory cells of one entry. In FIG. 2, word lines WLa and WLb disposed in correspondence with the entries ENT#a and ENT#b are shown.

In the sub-entry SERY, data storage cells CEL00 to CEL03 and CEL04 to CEL07 for storing information data and mask cells CEL10 to CEL13 for storing mask bits are aligned in the row direction (entry extending direction). Since the data storage cells CEL00 to CEL07 and the mask cells CEL10 to CEL13 have the same configuration, the configurations of the data storage cell CEL00 and the mask cell CEL10 are representatively shown in FIG. 2. The data storage cell CEL00 and the mask cell CEL10 have the same configuration, and the same reference numerals are designated to the corresponding parts.

Each of the data storage cell CEL00 and the mask cell CEL10 includes inverters INV1 and INV2 forming an inverter latch, and access transistors AT1 and AT2 for coupling input units of the inverters INV1 and INV2 to the bit lines BL and /BL in accordance with a signal on a corresponding word line WLa. Pairs of bit lines are disposed in correspondence with columns of the data storage cells and the mask cells. In FIG. 2, pairs of bits BL0 and /BL0 to BL3 and /BL3 are disposed in correspondence with memory cell columns including the storage cells CEL00 to CEL03. A pair of bit lines BL4 and /BL4 is disposed in correspondence with the memory cell column of the mask cell CEL10, and a pair of bit lines BL7 and /BL7 is disposed in correspondence with the memory cell column of the mask cell CEL13. Similarly, pairs of bit lines BL8 and /BL8 to BL11 and /BL11 are provided in correspondence with the memory cell columns including the data storage cells CEL04 to CEL07 for storing data.

As shown in FIG. 2, each of the data storage cells CEL0 (CEL00 to CEL07) and mask cells CEL1 (CEL10 to CEL13) has the same configuration as that of an SRAM cell. The data storage cells CEL00 to CEL07 and the mask cells CEL10 to CEL13 simply store information data and mask data, and an XOR circuit for performing match determination is not provided in each of the memory cells. Therefore, the occupation area of the memory cells CEL (CEL0 and CEL1) of the sub entry in the memory array 1 can be made smaller than that in the case of constructing a CAM cell by two SRAM cells and an XOR circuit like a conventional TCAM.

At the time of reading data, one word line is driven to a selected state, and data stored in an entry in a selected row is read out to a corresponding pair of bit lines. Also at the time of writing information and mask data, similarly, one word line is driven to a selected state, write data (information data and mask data) is transferred to a corresponding bit line pair, and the information/mask data is written to a memory cell.

Figure 3:
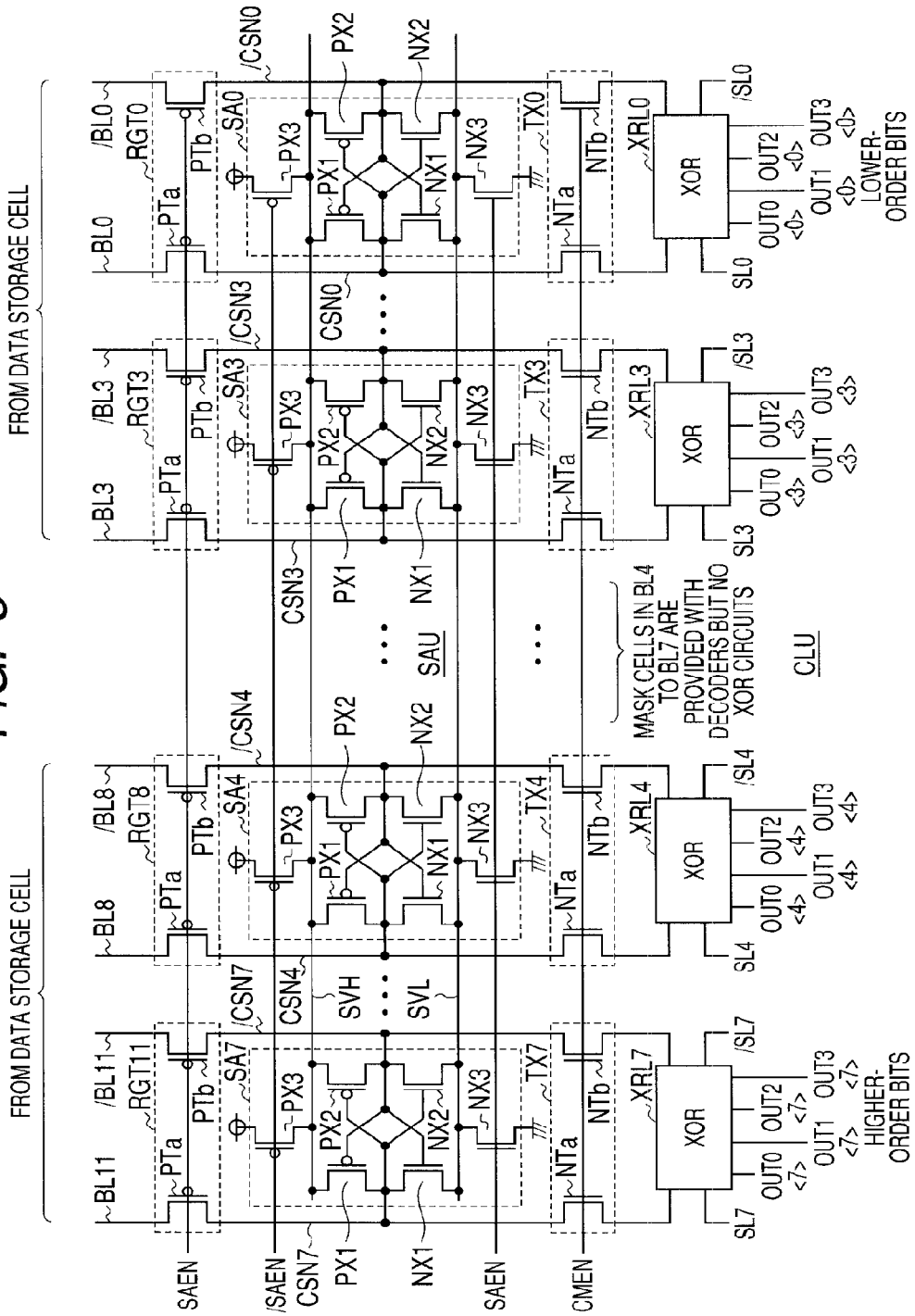
FIG. 3 is a diagram showing a concrete configuration of a sense amplifier circuit and a comparing/logic processing unit illustrated in FIG. 1.

FIG. 3 is a diagram showing an example of the configurations of the sense amplifier unit SAU and the comparing/logic unit CLU in FIG. 1. In FIG. 3, the sense amplifier unit SAU includes sense amplifiers SA0 to SA11 provided for the pairs of bit lines BL0 and /BL0 to BL11 and /BL11. In FIG. 3, the configurations of the sense amplifiers SA0 to SA3 and sense amplifiers SA8 to SA11 for the data storage cells are shown but sense amplifiers for mask cells for storing mask bits are not shown. However, sense amplifiers are also similarly provided for the pairs of bit lines BL4 and /BL4 to BL7 and /BL7 in which mask cells are disposed.

The sense amplifiers SA0 to SA11 have the same configuration. In FIG. 3, the same reference numerals are designated to corresponding components in the sense amplifiers SA0 to SA11. Each of the sense amplifiers SA0 to SA11 has P-channel MOS transistors (insulating gate field effect transistors) PX1 and PX2 which are cross coupled, N-channel MOS transistors NX1 and NX2 which are cross coupled, a P-channel MOS transistor PX3 for coupling a high-side sense power source node SVH to a power source node in accordance with a sense amplifier activate signal /SAEN, and an N-channel MOS transistor NX3 for coupling a low-side sense power source node SVL to the ground node in accordance with a sense amplifier activate signal SAEN. In FIG. 3, the high-side sense power source node SVH and the low-side sense power source node SVL are commonly coupled to the sense amplifiers SA0 to SA11. The high-side sense power source node SVH and the low-side sense power source node SVL may be separated to the sense amplifiers SA0 to SA11.

The sense amplifiers SA0 to SA11 are cross-coupled latch sense amplifiers. When activated, each of the sense amplifiers SA0 to SA11 differentially amplifiers the potential of corresponding one of sense nodes CSN0 and /CSN0 to CSN11 and /CSN11 and latches the amplified potential.

The sense amplifier unit SAU further includes bit line read gates RGT0 to RGT11 for coupling the pairs of bit lines BL0 and /BL0 to BL11 and /BL11 to the sense amplifiers SA0 to SA11 in response to inactivation of the sense amplifier activation signal SAEN. Since the bit line read gates RGT0 to RGT11 have the same configuration, in FIG. 3, the same reference numerals are designated to components corresponding to the bit line read gates RGT0 to RGT11. Each of the bit line read gates RGT0 to RGT11 includes P-channel MOS transistors PTa and PTb which are conducting when the sense amplifier activation signal SAEN is inactive and couple corresponding bit lines BL (BL0 to BL11) and /BL (/BL0 to /BL11) to corresponding sense nodes CSN (CSN0 to CSN11) and /CSN (/CSN0 to /CSN11).

The P-channel MOS transistors PTa and PTb are used in the bit line read gates RGT0 to RGT11 for the following reason. Each of the bit lines BL0 and /BL0 to BL11 and /BL11 is precharged to the power source voltage level by a not-shown bit line load circuit. Therefore, at the time of reading data stored in a memory cell, the bit line potential changes from the H level of the power source voltage level to a lower level. To reliably transmit the high-level bit line potential to the corresponding sense amplifier SA (SA0 to SA11), the P-channel MOS transistors PTa and PTb are used.

In the case where the bit line potential is set to a voltage level higher than a bit line precharge voltage (for example, power source voltage) when the sense amplifier activation signal SAEN is inactive, it is sufficient to use N-channel MOS transistors in the bit line read gates RGT0 to RGT11.

Also at the time of writing information and mask data, write data is transferred via the bit line read gate (the write path is not shown). In this case, it is unnecessary to use a sense amplifier. The memory cells are SRAM cells, and data is read in a nondestructive manner. Different from a DRAM (Dynamic Random Access Memory), rewriting of storage data is not requested.

The comparing/logic processing unit CLU includes four-output XOR circuits XRL0 to XRL3 and XRL4 to XRL7 provided in correspondence with the sense amplifiers SA0 to SA3 and SA8 to SA11. Each of the XOR circuits XRL0 to XRL3 and XRL4 to XRL7 corresponds to the comparator CMP shown in FIG. 1. The XOR circuits XRL0 to XRL3 and XRL4 to XRL7 are provided in correspondence with data storage cells, and XOR circuits are not provided for the mask cells storing mask bits, that is, the pairs of bit lines BL4 and /BL4 to BL7 and /BL7. As will be described later, decoders are disposed for the mask cells.

The comparing/logic processing unit CLU further includes sense data transfer gates TX0 to TX3 and TX8 to TX11 for coupling the sense amplifiers SA0 to SA3 and SA8 to SA11 to the XOR circuits XRL0 to XRL3 and XRL4 to XRL7, respectively, in accordance with an output enable signal CMEN. The sense data transfer gates are provided also for mask cells, and sense data of a corresponding sense amplifier is transferred to a decoder (not shown in FIG. 3). Since the sense data transfer gates TX0 to TX11 have the same configuration, the same reference numerals are designated to corresponding parts in FIG. 3. Each of the sense data transfer gates TX0 to TX11 includes N-channel MOS transistors NTa and NTb for coupling sense nodes CSN (CSN- to CSN11) and /CSN (/CSN0 to /CSN11) of a corresponding sense amplifier SA (any of SA0 to SA11) to a corresponding XOR circuit XRL (XRL0 to XRL7) in accordance with activation of the comparison enable signal CMEN.

Each of the XOR circuits XRL0 to XRL7 compares data transferred from a corresponding sense amplifier with data of the search lines SL (SL0 to SL7) and /SL (/SL0 to /SL7) and, according to a result of the comparison, generates four outputs OUT0 to OUT3. In FIG. 3, by the numerals in angle brackets, the bit positions of output signals of the XOR circuits XRL0 to XRL7 are indicated. For example, the XOR circuit XRL0 generates output bits OUT0<0>, OUT1<0>, OUT2<0>, and OUT3<0>. The bit position <0> indicates the least significant bit position in a corresponding sub-entry, and the bit position <7> indicates the most significant bit position in a corresponding sub-entry.

By the four output signals OUT0 to OUT3, a signal indicative of a result of the comparison/logic process for a match, size determination, and the like is generated.

Figure 4:
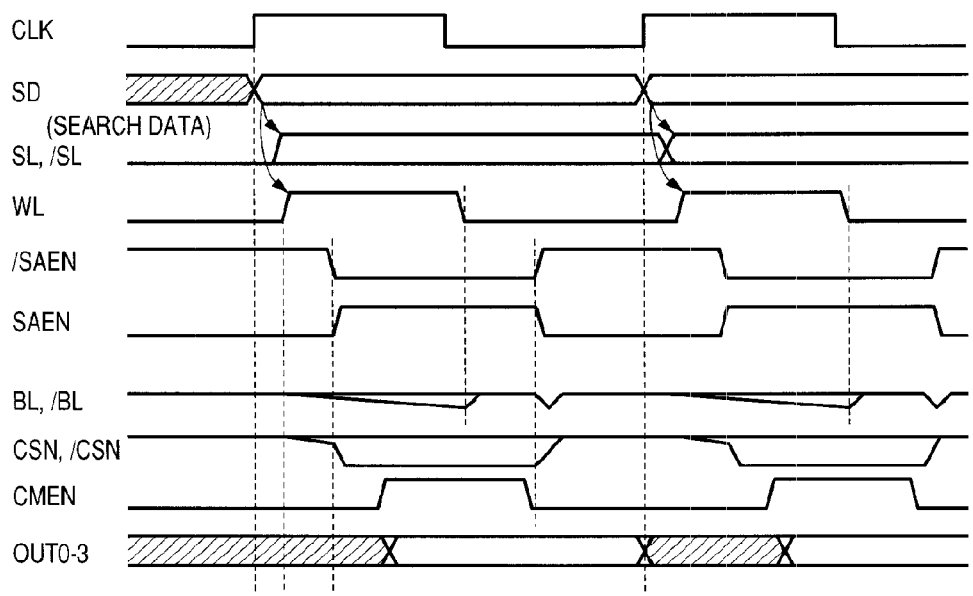
FIG. 4 is a timing chart showing operations of the circuits in FIGS. 1 to 3.

FIG. 4 is a timing chart showing operations of the content addressable memory illustrated in FIGS. 1 to 3. In the following, with reference to FIG. 4, the operations of the content addressable memory (CAM or TCAM) shown in FIGS. 1 to 3 will be described.

The search data SD is transferred synchronously with the clock signals CLK. It is assumed here that the content addressable memory (CAM) of the present invention is applied to a router or a switch in the Internet environment.

The search data SD is fetched in the CAM synchronously with the clock signal CLK and, accordingly, the search lines SL and /SL are driven to a voltage level according to the search data SD. FIG. 4 shows, as an example, a state that the search lines SL and /SL are precharged to the L level in a standby mode.

When the search data SD is given, one entry in the memory array 1 is designated and a corresponding word line WL is driven to a selected state in accordance with characteristic data (for example, a specific octet in an IP address) included in the search data SD. When the word line WL is driven to a selected state, access transistors AT1 and AT2 in the memory cells CEL0 and CEL1 in a selected entry are conducted, and storage data is transmitted to the corresponding bit lines BL and /BL. Reading of the data stored in the memory cell is the same as that of data stored in a normal SRAM. FIG. 4 shows, as an example, a state where the bit lines BL and /BL are precharged to the H level of the power source voltage.

At this time, the sense amplifier enable signal SAEN is still at the L level, and the bit line read gate RGT is in a conductive state. Therefore, a potential change in the bit lines BL and /BL is transmitted to the sense nodes CSN and /CSN. When the potential difference between the bit lines BL and /BL is enlarged, the sense amplifier enable signals SAEN and /SAEN are driven to the H level and the L level of the activation state. Accordingly, the bit line read gates RGT0 to RGT11 enter a nonconductive state, and a voltage from the bit lines is confined in sense nodes CSN0 and /CSN0 to CSN11 and /CSN11 of the sense amplifiers SA0 to SA11. In this state, the sense amplifier SA performs a sensing operation. According to the transferred storage data in the memory cells, the sense nodes CSN and /CSN are driven to the H level and the L level, and the data is latched.

After the latched data in the sense amplifiers SA0 to SA11 is decided, the comparison enable signal CMEN is activated, the sense data transfer gates TX0 to TX11 are conducted, the data latched in the sense amplifiers SA0 to SA3 and SA8 to SA11 is transferred to the XOR circuits XRL0 to XRL7 in the comparing/logic processing unit CLU, and the comparing process is executed. At this time, data latched in the sense amplifiers (SA4 to SA7) arranged in correspondence with the mask cells is transferred to the decoder DEC, and the comparing process in the XOR circuits XRL0 to XRL7 is selectively masked.

The XOR circuits XRL0 to XRL7 compare the transferred data with the search data. When the logic states of the output signals OUT0 to OUT3 (OUT0<0> and OUT3<0> to OUT0<7> and OUT3<7>) of the XOR circuits in the comparing/logic processing unit CLU are determined, the comparator enable signal CMEN is made inactive, and the sense amplifier enable signals SAEN and /SAEN are also made inactive. As a result, the bit lines BL and /BL are coupled to sense nodes CSN and /CSN of a corresponding sense amplifier SA via the bit line read gate RGT. Bit lines and sense nodes are precharged to a power source voltage level by a not-shown bit line load circuit. In the precharge state, the sense data transfer gate TX is in a nonconductive state, and the comparing/logic processing unit CLU and the sense amplifier unit SAU are isolated from each other.

As described above, the search data SD is simply transmitted to the XOR circuits XRL0 to XRL7 of the comparing/logic processing unit provided commonly for plural entries via the search lines SL0 and /SL0 to SL7 and /SL7. The search lines are not provided commonly for plural entries. Therefore, the amount of currents to be charged/discharged at the time of driving the search lines can be reduced and, accordingly, power consumption can be reduced. The comparing/logic process such as match determination is executed by the XOR circuits provided commonly for plural entries. It is therefore unnecessary to arrange the XOR circuit for each of memory cells, so that the layout area of the memory cells is reduced. For example, a match line for performing the match determination is provided commonly for plural entries, and the amount of current for charging/discharging the match line is largely reduced. For example, in the case where one comparing/logic processing unit 15 is disposed for 32 entries, the amount of current required for the comparing process can be reduced to 1/32.

In the configuration shown in FIG. 3, the bit line read gates RGT0 to RGT11 enters a nonconductive state during the sensing operation, and the sense amplifier and corresponding bit lines BL and /BL are isolated from each other. Therefore, the drive load during operation of the sense amplifier is small, and the sensing operation can be performed at high speed. With respect to the potential difference between the bit lines BL and /BL, the word line WL is driven to a nonselective state and, after that, the storage nodes in the memory cells are separated to corresponding bit lines BL and /BL. Consequently, the bit lines BL and /BL are charged by a not-shown bit line load circuit and the voltage levels rise. When the sense amplifier SA and the bit lines BL and /BL are coupled, the potentials on the bit lines BL and /BL decrease according to the data stored in the sense amplifier or according to load capacity. However, the bit lines BL and /BL are precharged again to the H level of the power source voltage by a corresponding bit line load circuit.

Figure 5:
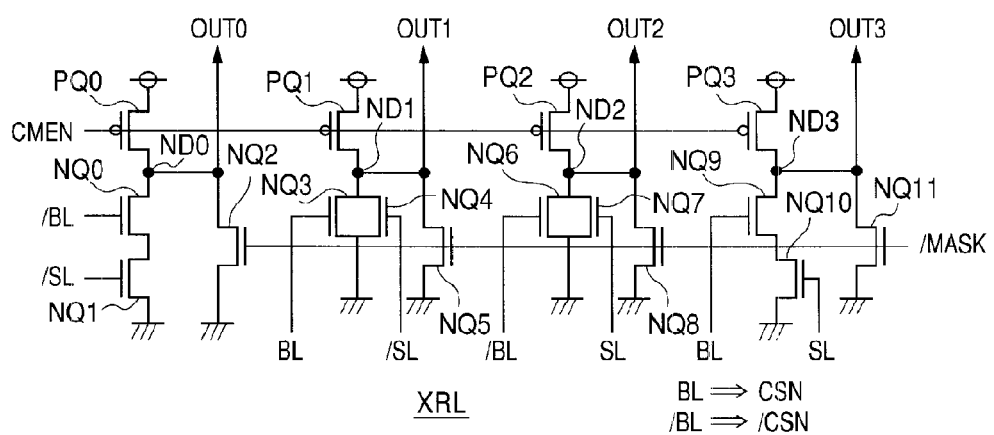
FIG. 5 is a diagram showing an example of the configuration of an XOR circuit in FIG. 3.

FIG. 5 is a diagram showing an example of the configuration of the XOR circuits XRL0 to XRL7 in FIG. 3. The XOR circuits XRL0 to XRL7 are the same except for the values of mask bits given. In FIG. 3, the configuration of one XOR circuit XRL is representatively shown. FIG. 5 representatively shows the configuration of one of the XOR circuits XRL.

In FIG. 5, the XOR circuit XRL includes P-channel MOS transistors PQ0 to PQ3 for precharging output nodes ND0 to ND3 of the output signals OUT0 to OUT3 to an inactive-state power source voltage level of the comparison enable signal CMEN. When the comparison enable signal CMEN becomes inactive and at the L level, the MOS transistors PQ0 to PQ3 are turned on and the output signals OUT0 to OUT3 are precharged to the H level.

N-channel transistors NQ0 to NQ2 are provided for the output signal OUT0. The N-channel MOS transistors NQ0 and NQ1 are coupled in parallel between the output node ND0 and the ground node, and their gates are coupled to the complementary bit line /BL and the complementary search line /SL. The N-channel MOS transistor NQ2 is coupled between the output node ND0 and the ground node and receives a mask instruction signal /MASK by its gate.

N-channel transistors NQ3 to NQ5 are provided for the output signal OUT1. The N-channel MOS transistors NQ3 and NQ4 are coupled in parallel between the output node ND1 and the ground node, and their gates are coupled to the bit line BL and the complementary search line /SL. The N-channel MOS transistor NQ5 is coupled between the output node ND1 and the ground node and receives the mask instruction signal /MASK by its gate.

N-channel transistors NQ6 and NQ7 are provided for the output signal OUT2. The N-channel MOS transistors NQ6 and NQ7 are coupled in parallel between the output node ND2 and the ground node, and their gates are coupled to the complementary bit line /BL and the search line SL. The N-channel MOS transistor NQ8 is coupled between the output node ND2 and the ground node and receives the complementary mask instruction signal /MASK by its gate.

N-channel transistors NQ9 to NQ11 are provided for the output signal OUT3. The N-channel MOS transistors NQ9 and NQ10 are coupled in series between the output node ND3 and the ground node, and their gates are coupled to the bit line BL and the search line SL. The N-channel MOS transistor NQ11 is coupled between the output node ND3 and the ground node and receives the complementary mask instruction signal /MASK by its gate.

The mask instruction signal /MASK instructs masking when it is at the H level ("1"). Specifically, when the mask instruction signal /MASK is "1" (H level), corresponding data bit is set to a "don't care state". Consequently, when the mask instruction signal MASK is at the H level, all of the output signals OUT0 to OUT3 are set to the L level ("0").

Figures 6, 7:
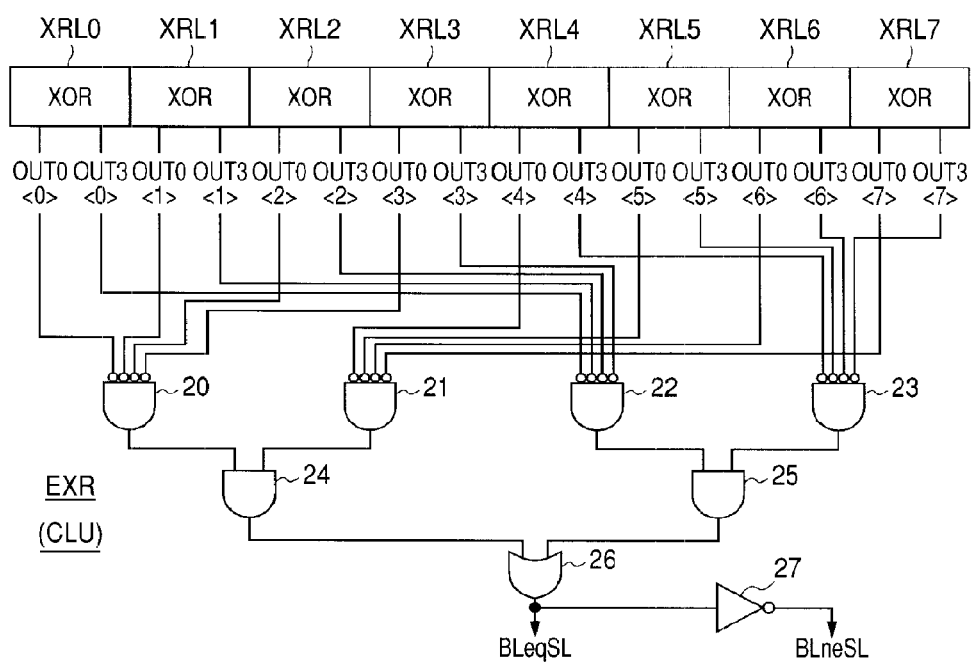
FIG. 6 is a diagram showing a list of logics of inputs and outputs of the XOR circuit of FIG. 5.
FIG. 7 is a diagram schematically showing an example of the configuration of a logic processing unit in the XOR circuit in FIG. 3.

FIG. 6 is a diagram showing a list of logics of input/output signals of the XOR circuit XRL in FIG. 5. With reference to FIG. 6, the operation of the XOR circuit shown in FIG. 5 will be described below.

It is assumed that data appears on the bit line BL and the search line SL, and complementary data bit appears on the complementary bit line /BL and the complementary search line /SL.

It is assumed that data amplified by the sense amplifier appears as the logic values of the bit lines BL and /BL (in the sensing operation in the charge confinement method, the voltage levels of the sense nodes CSN and /CSN are transmitted). However, in FIG. 6, the bit lines BL and /BL and the search lines SL and /SL are shown to indicate the corresponding relations between data stored in the data storage cells and the search data on the search lines.

When the mask instruction signal /MASK is at the L level, all of the MOS transistors NQ2, NQ5, NQ8, and NQ11 are in an off state. In this case, the logic levels of the output signals OUT0 to OUT3 are determined according to the logic levels of signals on the bit lines BL and /BL and the search lines SL and /SL. When the mask instruction signal /MASK is at the H level, all of the output signals OUT0 to OUT3 are at the L level.

The output signal OUT0 becomes "0" when both of signals on the complementary bit line /BL and the complementary search line /SL are "1". In this case, the data bit of "0" is transferred onto the bit line BL and the search line SL. Therefore, when the output signal OUT0 is "0", the data bit stored in the storage cell and the search data bit are equal to each other (shown by a flag EQ in FIG. 6). Also when masked, the output signal OUT0 becomes the L level, thereby showing a match.

The output signal OUT1 becomes "0" when the bit line BL is "1" or the search line /SL is "1". That is, when both of the complementary bit line /BL and the search line SL are "1", both of the MOS transistors NQ3 and NQ4 are in the off state, and the output signal OUT1 maintains the H level ("1") in the precharge state. In this case, it shows that the data bit stored in the data storage cell is "0", the search data bit is "1", and the search data bit is larger than the storage data bit appearing on the bit line BL (shown by the relational expression BL<SL). When masked, the output signal OUT1 becomes the L level, and it shows that the search data bit is not larger than the storage data bit.

The output signal OUT2 becomes "1" when the complementary bit line /BL is "0" and the search line SL is "0". In this case, the data bit on the bit line BL is "1", and the search data bit on the search line SL is "0". Therefore, it shows that the data bit stored in the data storage cell is larger than the search data bit (shown by the relational expression BL>SL). When masked, the output signal OUT2 becomes the L level, and it shows that the search data bit is not smaller than the storage data bit.

When the output signal OUT3 is "0", both of the bits on the bit line BL and the search line SL are "1". That is, when both of the data bit stored in the data storage cell and the search data bit are "1", the output signal OUT3 becomes the L level ("0"). When masked, the output signal OUT3 becomes the L level, and it shows that the search data bit and the storage data bit are equal.

That is, when the output signal OUT0 or OUT3 is "0", it shows that the data bit stored in the data storage cell and the search data bit transmitted via the search line are equal to each other. When the output signal OUT1 is "1", it shows that the search data bit is larger than the data bit stored in the data storage cell. When the output signal OUT2 is "1", it shows that the data bit stored in the data storage cell is larger than the search data bit.

Thereby, by expanding the output signals OUT0 to OUT3 of the XOR circuit to eight bits, match/mismatch and the size relation of the storage data and the search data can be detected on an octet unit basis. By further expanding the result of the logic process on the octet unit basis to an entry level, the match/mismatch and the size relation of a data sequence to be retrieved which is stored in an entry and search data transmitted via the search line can be determined.

FIG. 7 is a diagram schematically showing the configuration of a match determining unit of the comparing/logic processing unit CLU. In FIG. 7, in the comparing/logic processing unit CLU, XOR circuits XRL0 to XRL7 are provided in correspondence with the data bits. At the time of match determination, output signals OUT0<0> to OUT0<7> and OUT3<0> to OUT3<7> of the XOR circuits XRL0 to XRL7 are used. The output signals OUT0<0> to OUT0<3> are supplied to a 4-input NOR gate 20, and the output signals OUT0<4> to OUT0<7> are supplied to a 4-input NOR gate 21. The output signals OUT3<0> to OUT3<3> are supplied to a 4-input NOR gate 22, and output signals OUT3<4> to OUT3<7> are supplied to a 4-input NOR gate 23.

Output signals of the 4-input NOR gates 20 and 21 are supplied to a 2-input AND gate 24, and output signals of the 4-input NOR gates 22 and 23 are supplied to a 2-input AND gate 25. Output signals of the 2-input AND gates 24 and 25 are supplied to a 2-input OR gate 26.

As shown in FIG. 6, when the storage data and the search data matches (including the don't care state), the set of all of the output signals OUT0<0> to OUT0<7> or the set of all of the output signals OUT3<0> to OUT3<7> become "0". Therefore, at the time of a match, both of the output signals of the NOR gates 20 and 21 become the H level or both of the output signals of the NOR gates 22 and 23 become the H level ("1"). When a signal BLeqSL from the OR gate 26 which receives output signals of the AND gates 24 and 25 is "1" (H level), a match between the stored data and the search data is determined. By inverting the output signal of the OR gate 26 by an inverter 27, when an output signal BLneSL of the inverter 27 is "1", a mismatch between the stored data and the search data is determined.

In the comparing/logic processing unit CLU, decoding circuits are disposed between the four XOR circuits XRL0 to XRL3 and the XOR circuits XRL4 to XRL7. Therefore, the gates 20 to 27 can be disposed in plenty of area.

Figure 8:
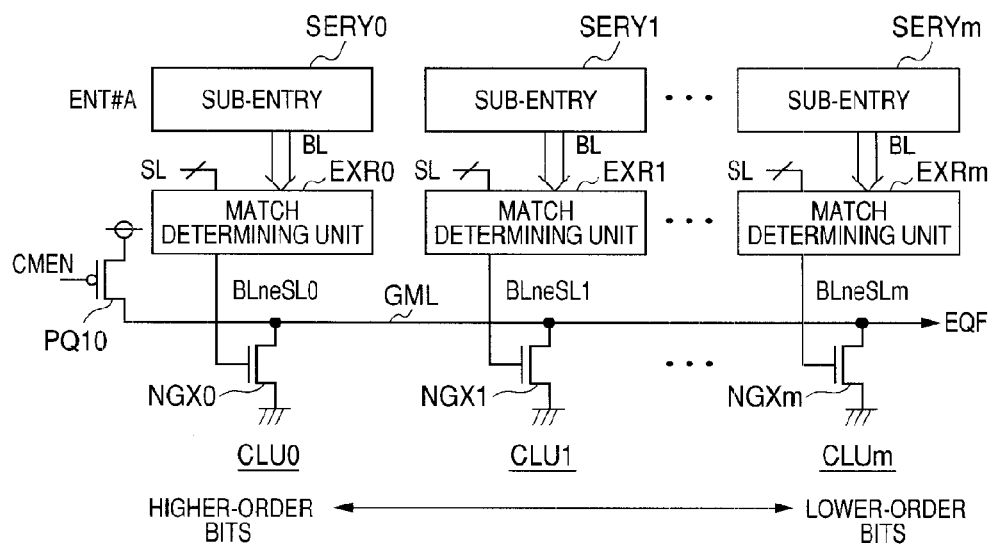
FIG. 8 is a diagram schematically showing the configuration of a part for outputting a result of match determination of the logic processing unit in FIG. 3.

FIG. 8 is a diagram showing an example of the configuration of a part illustrating a result of match/mismatch determination in one entry ENT#A. In FIG. 8, a global match line GML is disposed commonly to sub-entries SERY of the entry ENT#A. The entry ENT#A is divided into plural sub-entries SERY0 to SERYm. In correspondence with the sub-entries SERY0 to SERYm, match determining units EXR0 to EXRm are provided in the comparing/logic processing unit (CLU). The configuration of each of the match determining units EXR0 to EXRm corresponds to the configuration shown in FIG. 7.

In correspondence with the match determining units EXR0 to EXRm, N-channel MOS transistors NGX0 to NGXm are provided in parallel with the global match line GML. The MOS transistors NGX0 to NGXm receive mismatch detection signals BLneSL0 to BLneSLm by their gates and, when they are conducted, couple the global match line GML to the ground node. The global match line GML is provided with the P-channel MOS transistor PQ10 for precharging the global match line GML to the power source voltage level when the comparison enable signal CMEN is inactive.

In the configuration shown in FIG. 8, in the case where search data from the search line SL and storage data transmitted from a corresponding sub-entry via the bit line BL do not match in the match determining units EXR0 to EXRm, the corresponding mismatch detection signal BLneSL becomes the H level ("1"). Therefore, in the case where a mismatch is determined in any of the match determining units EXR0 to EXRm, any of the MOS transistors NGX0 to NGXm becomes conductive, the global match line GML is discharged, and the match instruction flag EQF becomes "0".

On the other hand, when a match determination is performed in all of the match determining units EXR0 to EXRm, all of the mismatch instruction signals BLneSL0 to BLneSLm are "0" (L level). Therefore, in this state, all of the MOS transistors NGX0 to NGXm are in an off state, and the match instruction flag EQF on the global match line GML maintains the H level. According to "0" and "1" of the flag EQF, match/mismatch between the storage data and the search data can be identified.

It is also possible to insert the match instruction flag EQF by an inverter and assert the mismatch instruction flag (NEQF) when a mismatch is detected.

Figure 9:
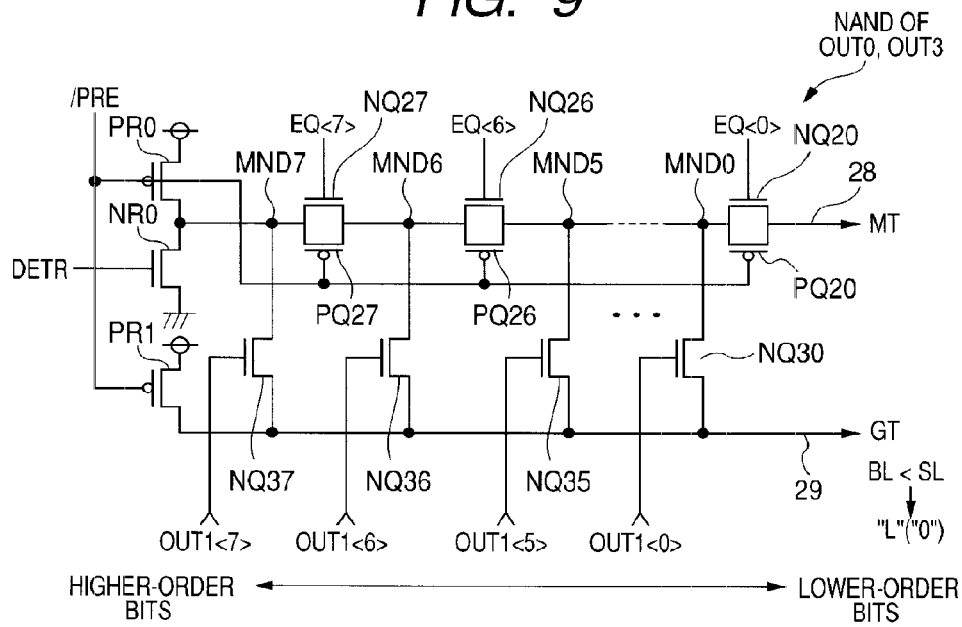
FIG. 9 is a diagram showing the configuration of a logic processing unit for performing size comparison in the logic processing unit in FIG. 3.

FIG. 9 is a diagram showing an example of the configuration of a size determining circuit included in the comparing/logic processing unit. In FIG. 9, the size determining circuit includes plural N-channel MOS transistors NQ20 to NQ27 coupled in series and P-channel MOS transistors PQ20 to PQ27 coupled in parallel with the MOS transistors NQ20 to NQ27. Match instruction bits EQ<0> to EQ<7> are supplied to the gates of the MOS transistors NQ20 to NQ27, respectively. Precharge instruction signals /PRE is supplied to the gates of the MOS transistors PQ20 to PQ27. By the MOS transistors NQ20 to NQ27, a local match line 28 is divided into segments MNA0 to MNA7.

The match instruction bits EQ<0> to EQ<7> are signals indicative of negative AND (NAND) of the output signals OUT0 and OUT3 of each of the XOR circuits XRL0 to XRL7. Specifically, in the case of a match, the signal level of the output signals OUT0 and OUT3 is "0". When the search data bit and the storage data bit match each other, the match instruction bits EQ<0> to EQ<7> are set to "1" (H level).

The node MND7 in the most significant bit position is provided with a P-channel MOS transistor PR0 for charging and an N-channel MOS transistor NR0 for discharging. The MOS transistor PR0 becomes conductive when the precharge instruction signal /PRE is made active, and couples the node MND7 to the power source node. The N-channel MOS transistor NR0 becomes conductive when a size determination enable signal DETR is made active, and couples the node MND7 to the ground node. Therefore, when the precharge instruction signal /PRE is made active, the MOS transistors PQ24 to PQ27 are turned on, and all of the nodes MND0 to MND7 of the local latch line 28 are precharged to the power source voltage level by the MOS transistor PR0.

N-channel MOS transistors NQ30 to NQ37 are provided between the nodes MND0 to MND7 and a size detection line 29. The MOS transistors NQ30 to NQ37 receive, by their gates, the output signals OUT1<0> to OUT1<7> of the corresponding XOR circuits. Each of the signals OUT1<0> to OUT1<7> is set to "1" when a corresponding search data bit is larger than data stored in a corresponding data storage cell.

The size detection line 29 is provided with the P-channel MOS transistor PR1 which becomes conductive in response to a precharge instruction signal /PRE. The size detection line 29 is precharged to the power source voltage level at the time of precharging.

Figure 10:
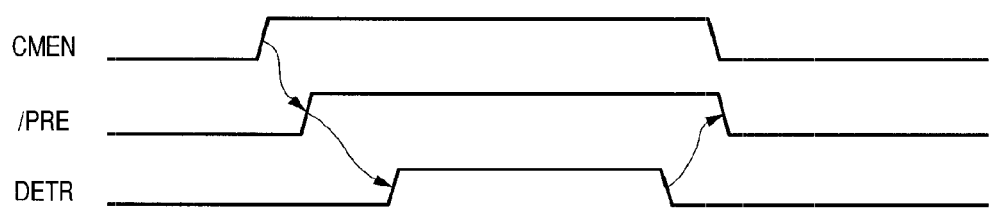
FIG. 10 is a timing chart showing the operation of the logic processing unit in FIG. 9.

FIG. 10 is a signal waveform chart showing operations of the size determining unit illustrated in FIG. 9. In the following, the operation of the size determining unit in FIG. 9 will be described with reference to FIG. 10.

Before the comparing/logic processing operation, that is, before activation of the comparison enable signal CMEN, the precharge instruction signal /PRE is at the L level, the local match line 28 is precharged to the power source voltage level, and the size detection line 29 is precharged to the power source voltage level.

When the comparison activate signal CMEN is made active, accordingly, the precharge instruction signal /PRE is also made inactive, and precharging to the power source voltage level of the local match line 28 and the size detection line 29 is stopped. After that, match detection and size determination is performed in the XOR circuits XRL0 to XRL7.

When the states of the output signals OUT1<0> to OUT<7> of the XOR circuits XRL0 to XRL7 are determined and the states of the match instruction signals EQ<0> to EQ<7> are determined, the size determination enable signal DETR is made active. Accordingly, the MOS transistor NR0 is conducted, and the node NND7 is discharged to the ground voltage level. In the case where the data stored in the data storage cell included in a corresponding sub-entry and the search data appearing on the search line match, all of the match instruction signals EQ<0> to EQ<7> are in the active state, and all of the MOS transistors NQ20 to NQ27 are in the conductive state. In this state, the entire local match line 28 is discharged to the ground voltage level by the MOS transistor NR0.

In the case where the search data and the storage data match (including the don't care state), all of the output signals OUT1<0> to OUT1<7> are at the L level ("0"), the MOS transistors NQ30 to NQ37 are in the off state, and the size determination line 29 maintains the H level of the precharge voltage.

In the case where the search data and the storage data (data to be retrieved) match, the match instruction flag MT from the local match line 28 becomes the L level ("0"), and a size determination flag GT on the size detection line 29 becomes the H level ("1").

The case where search data is smaller than data stored in the data storage cell will be examined. In this case, in the most significant bit position of a mismatch, the data bit on the bit line BL is "1", and the data bit on the search line SL is "0". Under the conditions, the MOS transistor corresponding to the most significant bit position of the mismatch in the N-channel MOS transistors NQ20 to NQ27 is in the off state. Therefore, the match instruction flag MT on the local match line 28 is isolated from the MOS transistor NR0 by a MOS transistor corresponding to the mismatch detection bit, and no discharge is performed. Consequently, the match instruction flag MT is maintained at the H level of precharging.

The output signal OUT1 of an XOR circuit corresponding to the most significant bit in bits of mismatch is "0" (L level), and a corresponding MOS transistor is in the off state. In bits higher than the mismatch bit position, the search data bit and the cell storage data matches. Therefore, in this case as well, the output signal OUT1 is "0" and, in the MOS transistors NQ30 to NQ37, MOS transistors higher than the mismatch bit position are in the off state. Consequently, the size detection line 29 is isolated from the local match line 28 in the most significant bit position of mismatch and higher bit positions. In the bit positions lower than the most significant bit position of mismatch, the local match line 28 is not discharged. Therefore, even when the output signal OUT1 becomes the H level ("1") in bits lower than the most significant bit of mismatch, a path of discharge to the ground voltage level of the size detection line 29 does not exist. Therefore, the size determination flag GT from the size detection line 29 maintains the H level ("1").

When the search data is smaller than the data to be retrieved (data stored in the cell), the match instruction flag MT becomes the H level, and the size determination flag GT becomes the H level.

Next, the case where search data is larger than storage data will be examined. In this case, the data bit on the search line SL is "1", the data bit on the corresponding bit line BL is "0", and the output signal OUT1 of the corresponding XOR circuit is "1". Therefore, the MOS transistor in the most significant bit position of mismatch in the MOS transistors NQ30 to NQ37 is turned on.

In this case, also in the MOS transistors NQ20 to NQ27 on the local match line 28, the MOS transistor corresponding to the most significant position of mismatch is turned off. Therefore, in the case where it is determined that the search data bit in the most significant bit after the match bit is larger than the storage data bit, the size detection line 29 is discharged by a corresponding MOS transistor in the MOS transistor NR0 and the MOS transistors NQ30 to NQ37. Therefore, when the search data is larger than the storage data, the size determination flag GT on the size detection line 29 becomes the L level. In the local match line 28, a corresponding MOS transistor is turned off in the mismatch bit position, the local match line 28 is disconnected, and the whole is not discharged. Therefore, the mismatch instruction flag MT maintains the H level ("1") of the precharge state.

Even if the "don't care state" exists higher than the most significant bit position of mismatch, the state is identified as a match state, so that a corresponding MOS transistor on the local match line is turned on. Therefore, even if the corresponding MOS transistor between the size detector 29 and the local match line is turned off, the size determination is performed accurately in accordance with the most significant bit of mismatch of the next stage or after that.

That is, in the case where search data is larger than the storage data (data to be searched), the match instruction flag MT becomes the H level, and the size determination flag GT becomes the L level.

In such a manner, the voltage level (logic level) of the size determination flag GT from the size detection line 29 can be set to a voltage level according to the sizes of the data stored in the most significant bit of mismatch and the search data bit. By expanding the match and size determined on the sub-entry unit basis to all of the entries, the match and size of the search data and the data to be retrieved can be determined by using the match detection result. The size is determined by using a match determination result, so that the circuit configuration for size determination can be simplified and the occupation area of the size determination circuit can be reduced.

Figure 11:
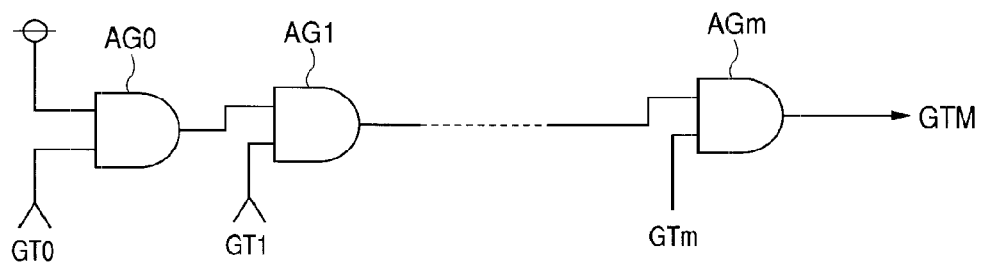
FIG. 11 is a diagram showing the configuration of a part for generating a final data size instruction flag of the logic processing unit in FIG. 3.

FIG. 11 is a diagram showing an example of the configuration of the circuit part for determining the size relation between a data sequence of an entry and search data. In FIG. 11, AND gates AG0 to AGm are provided in correspondence with comparing/logic processing units corresponding to a sub-entry. The AND gates AG0 to AGm receive size determination flags GT0 to GTm, respectively, from corresponding logic processing units by their first input terminals, and receive output signals of the AND gates in the preceding stages by their second input terminals. The second input terminal of the AND gate AG0 in the first stage is coupled to the power source node. The AND gate AG0 in the first stage corresponds to the most significant bit position.

In the configuration shown in FIG. 11, when higher-order size determination flags GT in the size determination flags GT0 to GTm are set to the L level, irrespective of the logic level of the size determination flag GT of the next stage or subsequent stages, the main size determination flag GTM from the AND gate AGm at the final stage is fixed to the L level. It shows that the search data is larger than the storage data.

With respect to a match between entry data and search data, when the match instruction flag MT from a subentry is at the L level indicating that all of data is matched, the final match flag is set to the H level ("1"). By using a NOR gate, a final match flag can be generated according to the perfect match instruction flags GT0 to GTm.

It is determined that the search data is smaller than the storage data when both of the final main size determination flag GTM and the final match instruction flag (negative OR of the match instruction flag) MT are at the H level. Alternatively, in the configuration shown in FIG. 11, OR gates are used in place of the AND gates, and the ground voltage is supplied in place of the power source voltage to the first input terminal of the OR gate in the first stage.

By providing the circuit configuration of performing size determination bit by bit in each of the XOR circuits as described above, the size relation with storage data of a data bit can be performed on a sub-array unit basis. Accordingly, the size relation between the entry data sequence and the search data sequence can be determined. In this case, a size determination circuit is disposed for plural entries. As compared with the configuration of providing the size determination circuit for each of the cells, the occupation area can be reduced. A match line and a size detection line are also provided commonly for plural entries, so that the charge/discharge current can be reduced. The match and size determination is performed on the sub-entry unit basis and, after that, a final determination result (match/size determination result) is generated by combining results of determination of the sub-entries. Therefore, as compared with the configuration of disposing the match line or the size detection line for an entire entry and performing the charging/discharging, the determination result can be generated at higher speed.

Configuration of Decoder

In each octet unit, mask bits are four bits in the present invention, so that the invention is limited to 16 ways of writing of mask information. Usually, in a CAM, mask bits are stored in unit cells. Consequently, 256 ways of mask information can be written in the octet unit. As the configuration of a decoder, the number of mask bit patterns can be reduced or not is considered. A representative application of a TCAM is an address search such as forwarding of an IP address. In the forwarding of an IP address, an address path search is performed according to the longest match search rule.

Figures 12, 13:
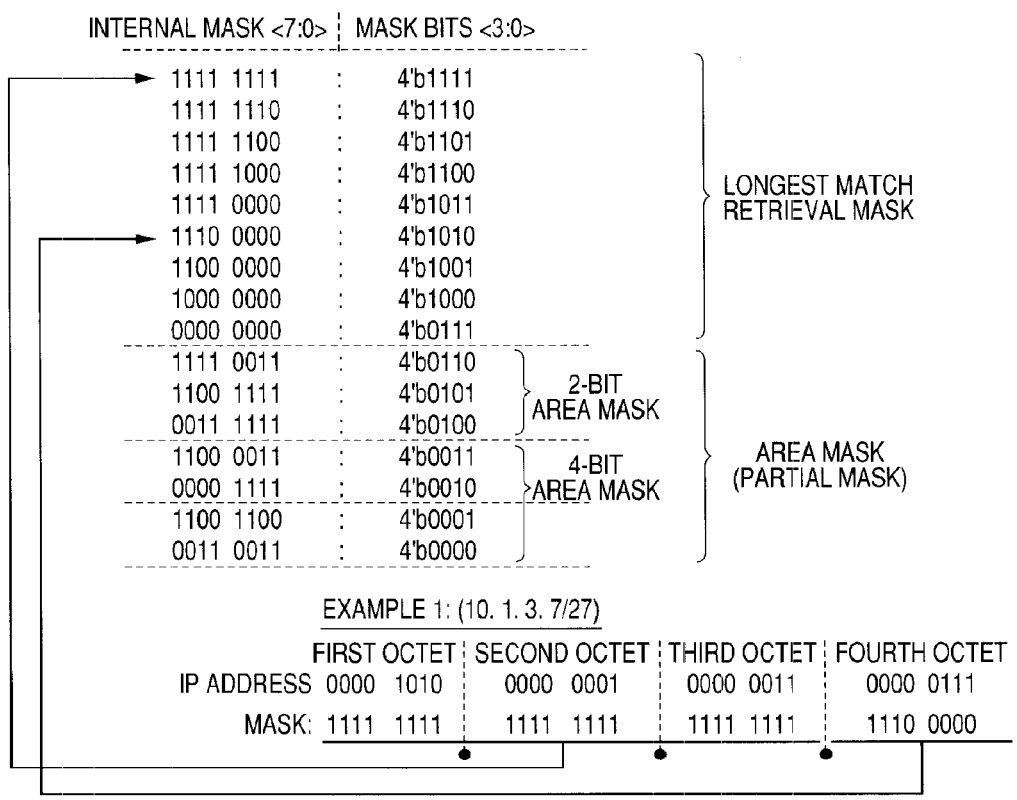
FIG. 12 is a diagram of a list showing the relations between mask bits of mask cells and internal mask instruction signals for masking the inside used in the first embodiment of the invention.
FIG. 13 is a diagram showing an example of a mask bit pattern to which the present invention is not applied.

As shown in FIG. 12, one IP address is expressed by 32 bits (in the case of IPv4 (Internet version 4)) as shown in example 1. For an effective bit, a mask bit is set to "1". In this case, the IP address is divided with periods on the octet unit basis. Each of the IP addresses is expressed in decimal number, and after "/", the number of effective bits is shown. In FIG. 12, as an example, the case where an IP address is 10.1.3.7/27 is shown.

In the case where the IP address is displayed in binary number, as shown by an IP address of FIG. 12, the IP address is divided into first to fourth octet parts, and the decimal numbers 10, 1, 3, and 7 are stored in the first to fourth octet parts, respectively. In the fourth octet part, five mask bits are set to "0". For arrangement of mask bits, there is a rule peculiar to the application of an IP address such that "0" is set in order always from the lower bits. Therefore, in the case of performing masking on the octet unit basis, it is sufficient to prepare mask bits corresponding to nine ways of bit patterns from "11111111" to "00000000". In FIG. 12, the internal mask <7:0> shows mask bits for octet data, and mask bits <3:0> are bits stored in mask cells.

Another representative application of the TCAM is an access control list (ACL). In the ACL, basically, a packet discarding process is executed by combining an IP address of a transmitter, a TCP port number, and the like. Consequently, it is sufficient to provide the function of masking an area corresponding to the number of combinations. In the embodiment, an entry is divided into sub-entries on the octet unit basis. Therefore, the area masking on the 8-bit unit basis is already possible. As shown in FIG. 12, for the use of the ACL, it is sufficient to add three kinds of patterns each for masking an area of two bits and four kinds of bit patterns each for masking an area of four bits.

On the other hand, masks for addresses as shown in FIG. 13 are hardly generated in the application of the present invention. It is unnecessary to consider such a mask bit pattern in which mask bits "0" and "1" mixedly exist. Therefore, by masking octet storage data by using the 4-bit mask, the number of memory cells of an entry can be reduced to 3/4 (=12/16).

Figure 14:
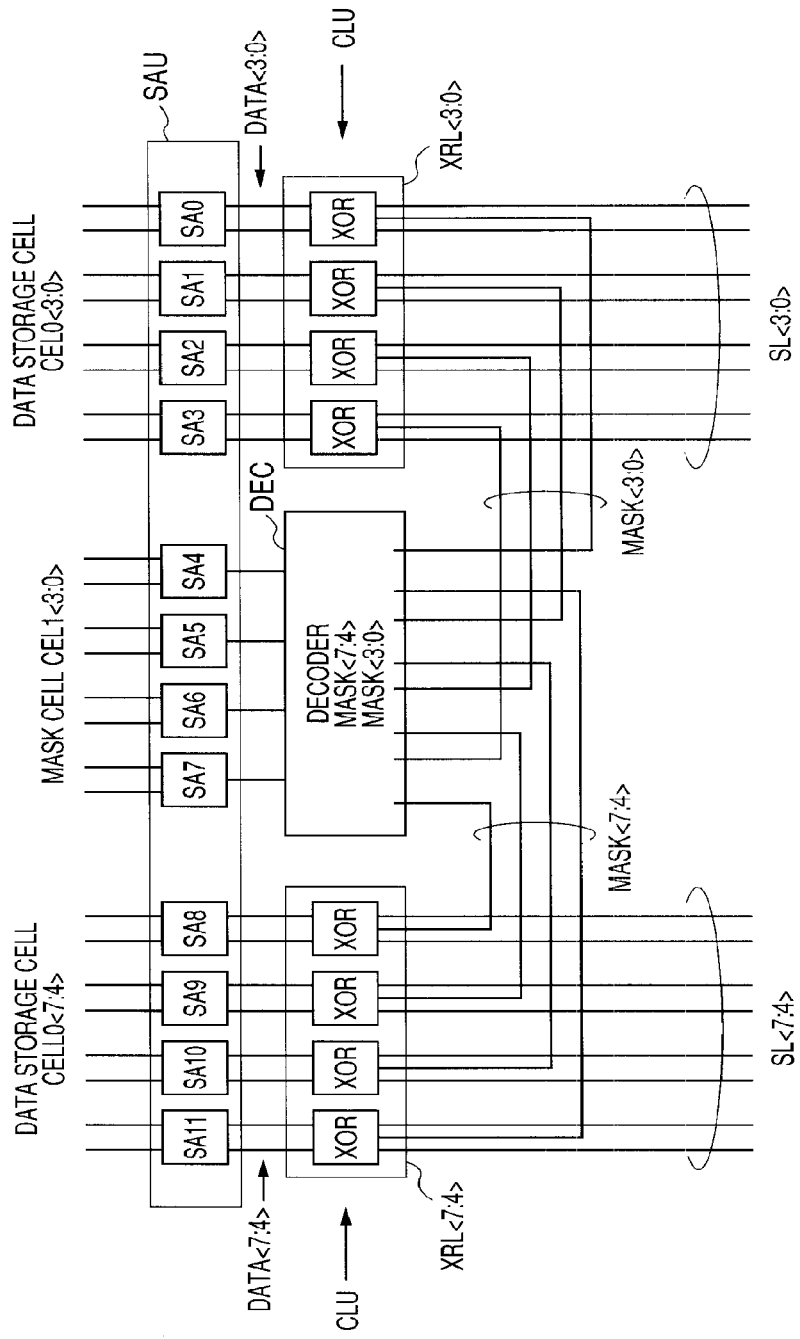
FIG. 14 is a diagram concretely showing the configuration of the logic processing unit in FIG. 3.

FIG. 14 is a diagram schematically showing arrangement of the comparing/logic processing unit CLU. In FIG. 14, arrangement of the sense amplifier unit SAU provided in correspondence with the comparing/logic processing unit CLU is also shown.

In FIG. 14, sense amplifiers SA11 to SA0 are disposed in correspondence with data storage cells CEL0<7:4>, mask cells CEL1<3:0>, and data storage cells CEL0<3:0>, and amplify storage data bits supplied via bit line pairs. A decoder DEC is disposed in correspondence with the sense amplifiers SA7 to SA4. On both sides of the decoder DEC, XOR circuit groups XRL<7:4> and XRL<3:0> are disposed. The XOR circuit group XRL<7:0> expresses the XOR circuits XRL7 to XRL0 shown in FIG. 3.

Higher-order mask instruction signals MASK<7:4> from the decoder DEC are given to the XOR circuit group XRL<7:4>, and lower-order mask instruction signals MASK<3:0> are given to the XOR circuit group XRL<3:0>.

To the XOR circuit group XRL<7:4>, the search data bits are supplied via the search lines SL<7:4>. To the XOR circuit group XRL<3:0>, search data bits are supplied via the search lines SL<3:0>.

FIG. 15 is diagram schematically showing an example of the configuration of the decoder DEC illustrated in FIG. 14. In FIG. 15, the decoder DEC includes registers REG15 to REG0 for storing the mask data MASK<7:0> of eight bits, respectively, and a register selecting circuit RGSEL for receiving data from the mask cells CEL1<3:0> given via the output signals SA<7:4> from the sense amplifiers SA7 to SA4 and selecting a register.

The higher-order mask data MASK<7:4> of data stored in the register selected by the register selecting circuit RGSEL is given as a mask instruction signal to the XOR circuit group XRL<7:4>. The lower-order mask data MASK<3:0> is given as a mask instruction signal to the XOR circuit group XRL<3:0>.

The decoder DEC shown in FIG. 15 has a configuration similar to that of a normal register file. The mask data MASK<7:0> corresponding to an internal mask shown in FIG. 12 is stored in the registers REG15 to REG0. By the register selecting circuit RGSEL, one register is selected according to the data from the sense amplifiers SA7 to SA4. As a result, a mask instruction signal of eight bits can be generated according to the mask data from the mask cells of four cells.

The decoder DEC is disposed in the area corresponding to the four sense amplifiers SA7 to SA4. Therefore, four register columns each including four registers in the registers REG15 to REG0 are provided. One of the register columns is selected according to data stored in the higher-order mask cells CEL1<3:2>, and one of the four registers is selected from the four registers in the column according to the data stored in the lower-order mask cells CEL1<1:0> in the selected register column. In such a manner, the decoder DEC constructed by a register file storing 16 words can be disposed in plenty of room in correspondence with the region in which the four sense amplifiers SA7 to SA4 are disposed.

According to the mask instruction signals MASK<7:4> and MASK<3:0> from the decoder DEC, the XOR circuit groups XRL<7:4> and XRL<3:0> execute match determination and/or size determination of the search data on the search lines SL<7:4> and SL<3:0> and the data <7:4> and <3:0> from the sense amplifiers.

Modification of Decoder

FIG. 16 is a diagram showing a list of decoding logics of a modification of the decoder DEC. In the 4-bit mask cells CEL1<3:0>, when the mask cells CL<1:0> of lower two bits is "10", the mask instruction signal of upper four bits (mask data) MASK<7:4> is set to "1111". As the values of the mask cells CL<3:2> of upper two bits decrease, the number of zeros in the mask instruction signal MASK<3:0> of lower four bits is gradually increased from the lower-order bit side using the fact that, in the case of longest match retrieval, data is masked from the lower-order bit side.

When data stored in the mask cells CEL1<1:0> of the lower two bits is "01", the mask instruction signal MASK<3:0> of the lower four bits is fixed to "0000". The number of zeros in the mask instruction signal MASK<7:4> of upper four bits is changed according to the value stored in the mask cells CEL1<3:2> of upper two bits. In this case, as the values stored in the mask cells CL<3:2> of upper two bits change like 10, 01, 00, and "11", the number of zeros in the mask instruction signal MASK<7:4> of upper four bits is increased in order from the lower bit side.

In the case where data stored in the mask cells CEL1<1:0> of lower two bits is "11", the mask instruction signal MASK<7:4> of eight bits and the mask instruction signal MASK<3:0> of four bits are set to "1111" and "0000", respectively.

Figure 17:
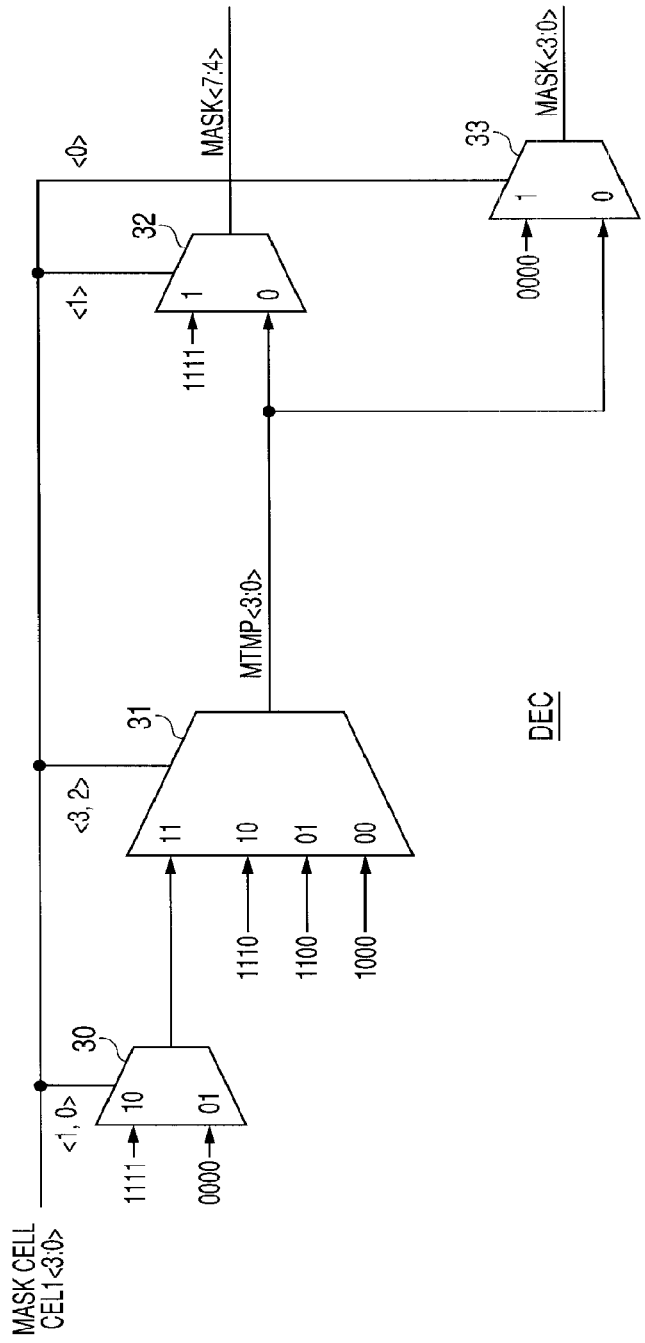
FIG. 17 is a diagram schematically showing an example of the configuration of a decoder realizing the decoding logics illustrated in FIG. 16.

FIG. 17 is a diagram schematically showing an example of the configuration of the decoder DEC realizing the decoding logics illustrated in FIG. 16. In FIG. 17, multiplexers in three stages are provided. A multiplexer 30 in the first stage selects one of "1111" and "0000" in accordance with the values stored in the mask cells CEL1<1,0> of lower two bits. When the bit values stored in the mask cells CEL1<1,0> are "10", the multiplexer 30 selects "1111". When the bit values are "01", the multiplexer 30 selects "0000". When the values stored in the mask cells CEL1<1,0> of lower two bits are "11", the multiplexer 30 does not select anything and its output becomes an indefinite state (as will be described below, the indefinite state is not a problem).

A multiplexer 31 in the second stage selects one of the output bits of the multiplexer 30, "1110", "1100", and "1000" in accordance with the values stored in the mask cells CEL1<3,2> of upper two bits. The multiplexer 31 utilizes the fact that, as shown in FIG. 16, the pattern of the lower-order mask instruction signal MASK<3:0> when data stored in the mask cells CEL1<1:0> of lower two bits is "10" and that of the higher-order mask instruction signal MASK<7:4> when data stored in the mask cells CEL1<1:0> of lower two bits is "01" are the same except for the case where the bit values stored in the mask cells CEL1<3,2> of upper two bits are "11". For example, in the case where data stored in the mask cells CEL1<3:2> of higher two bits is "10", the mask instruction signal MASK<7:4> of eight bits or the mask instruction signal MASK<3:0> of four bits is "1110".

In the third stage, two multiplexers 32 and 33 are provided in parallel. The multiplexer 32 selects one of "1111" and output bits MTMP<3:0> of the multiplexer 31 in accordance with the bit value stored in the mask cell CEL1<1> of one bit, thereby generating the mask instruction signal MASK<7:4> of upper four bits. The multiplexer 33 selects one of "0000" and the output bits MTMP<3:0> of the multiplexer 31 in accordance with the bit value of the least significant mask cell CEL1<0>, thereby generating the mask instruction signal MASK<3:0> of lower four bits.

The multiplexers 32 and 33 use the following fact. As shown in FIG. 16, when the bit value stored in the mask cell CEL1<1> is "1", the bit mask instruction signal MASK<7:4> of upper four bits is "1111". When the bit value stored in the least significant mask cell CEL1<0> is "1", the bit mask instruction signal MASK<3:0> of lower four bits is "0000".

In the case of the configuration of the decoder DEC shown in FIG. 17, when the bit values stored in the mask cells CEL1<1,0> are "11", output data of the multiplexer 30 becomes an indefinite state. However, in this case, the multiplexers 32 and 33 in the final stage select "1111" and "0000", respectively. Consequently, the indefinite state of an output signal of the multiplexer 30 does not exert any adverse influence on the logic values of the mask instruction signal MASK<7:0>.

In the decoder DEC, the bit pattern to be selected which is given to the multiplexers 30 to 33 is stored in, for example, a register. Even when the multiplexers are provided in three stages, the multiplexers 30 to 33 are simply constructed by transmission gates, so that propagation delay can be decreased sufficiently. The process of the comparison determination (match determination and size determination) in the XOR circuit group (match detection circuit group) XRL<7:0> can be masked reliably.

The configuration of the decoder DEC shown in FIGS. 16 and 17 is used for forwarding of an IP address rather than control of an ACL. In the XOR circuit in the decoder DEC shown in FIG. 17, as will be described below, match determination of three values is performed.

Figure 18:
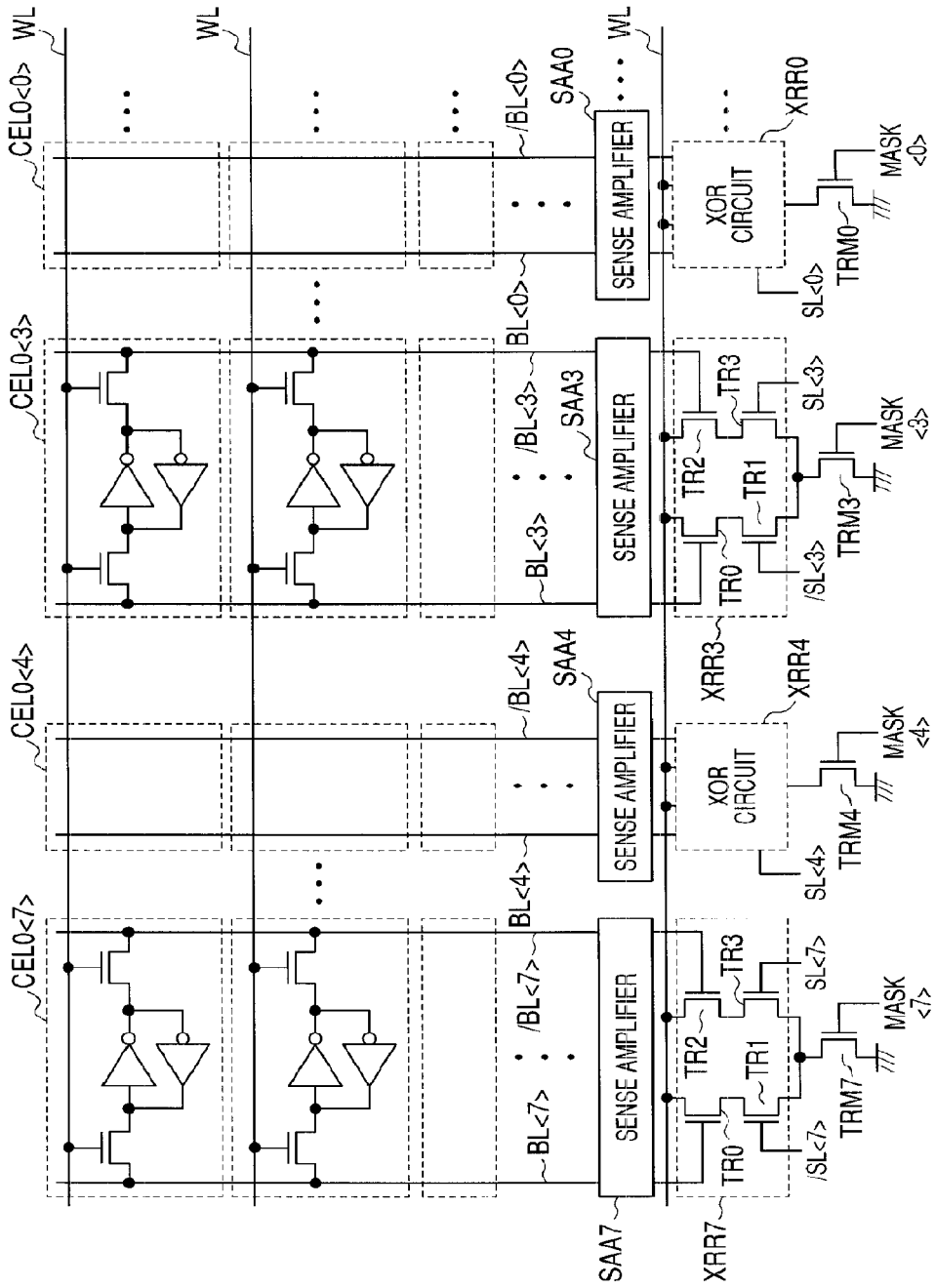
FIG. 18 is a diagram schematically showing the configuration of a TCAM as a modification of the first embodiment of the invention.

FIG. 18 is a diagram schematically showing the configuration of a main part of a CAM as a first modification of the first embodiment of the invention. In the configuration of FIG. 18, the match detecting operation is selectively masked according to mask instruction signals MASK<7> to MASK<0> from the decoder shown in FIGS. 16 and 17.

In FIG. 18, pairs of bit lines BL<7> and /BL<7> to BL<0> and /BL<0> corresponding to the data storage cells CEL0<7:0> in one sub-entry are shown. Sense amplifiers SAA7 to SAA0 are provided in correspondence with the pairs of bit lines BL<7> and /BL<7> to BL<0> and /BL<0>. XOR circuits XRR7 to XRR0 for detecting a match are provided in correspondence with the sense amplifiers SAA7 to SAA0.

Each of the XOR circuits XRR7 to XRR0 includes N-channel MOS transistors TR0 and TR1 coupled to each other in series, and MOS transistors TR2 and TR3 coupled to each other in series. The MOS transistors TR0 and TR2 receive complementary output signals supplied via the sense amplifiers from corresponding bit lines BLi and /BLi by their gates, and the gates of the MOS transistors TR1 and TR3 are coupled to the search lines /SL and SL. The MOS transistors TR0 and TR2 are coupled in parallel to the match line ML.

The XOR circuits XRR7 to XRR0 are provided with mask transistors TRM7 to TRM0 for receiving the mask instruction signals MASK<7> to MASK<0> by their gates. Each of the mask transistors TRM7 to TRM0 is an N-channel MOS transistor. Each of the mask transistors TRM7 to TRM0 is coupled to a common source node of the MOS transistors TR1 and TR3 of corresponding one of the XOR circuits XRR7 to XRR0.

In the configuration of FIG. 18, when the mask instruction signal MASK<i>(i=0 to 7) is "1", a corresponding mask transistor TRMi is turned on. A corresponding XOR circuit XRRi performs the match determining operation. When the search data bit and the storage data bit from the data storage cell do not match, one of two transistor series bodies is conducted to discharge the match line ML. In this case, a MOS transistor coupled to the bit line BL and a MOS transistor coupled to the complementary search line /SL are coupled in series, and a MOS transistor coupled to the bit line /BL and a MOS transistor coupled to the search line SL are coupled in series.

On the other hand, when the corresponding mask instruction signal MASK<i> is "0", the corresponding mask transistor TRMi is in the off state, and the corresponding XOR circuit XRRi does not perform the determining operation. Consequently, no influence is exerted on the precharge potential of the match line ML.

As described above, by using the configuration of FIG. 18, the CAM of the present invention can be used as a TCAM for performing ternary determination.

Modification of CAM

Figure 19:
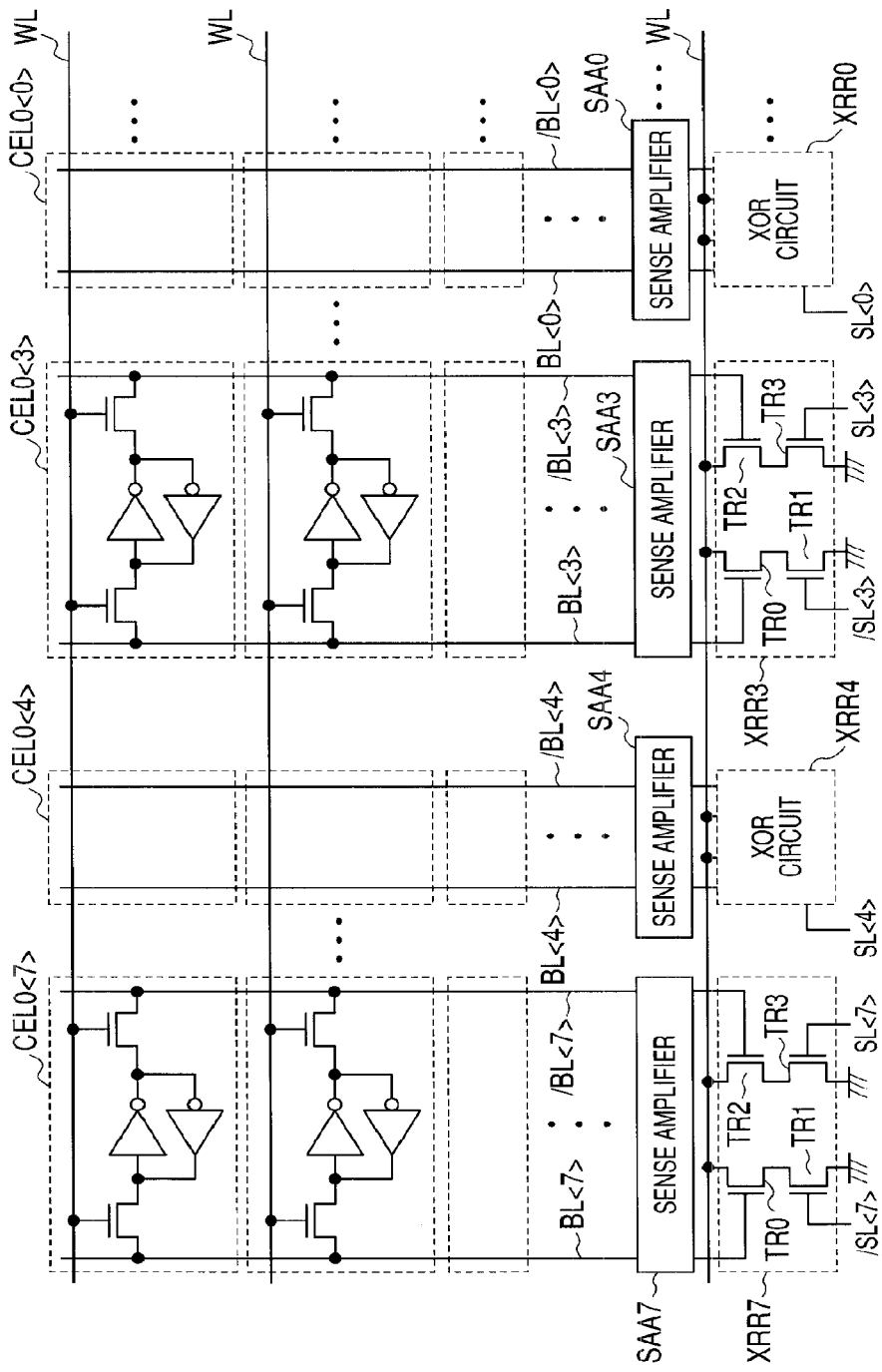
FIG. 19 is a diagram schematically showing the configuration of a binary CAM as a second modification of the TRAM of the first embodiment of the invention.

FIG. 19 is a diagram schematically showing the configuration of a modification of the CAM as the first embodiment of the present invention. The configuration of the CAM shown in FIG. 19 is different from that of the TCAM (ternary CAM) shown in FIG. 18 with respect to the following point. That is, the mask transistors TRM7 to TRM0 are not provided for the XOR circuits XRR7 to XRR0. In the XOR circuits XRR7 to XRR0, the source nodes of the MOS transistors TR1 and TR3 are coupled to the ground node. The other configuration of the CAM shown in FIG. 19 is the same as that of the TCAM shown in FIG. 18. The same reference numerals are designated to corresponding parts and their detailed description will not be repeated.

In the case of the configuration of the CAM shown in FIG. 19, the XOR circuits XRR7 to XRR0 determine match/mismatch between data bits from corresponding data storage cells and search data bits transmitted via the search line SL. The XOR circuits XRR7 to XRR0 just perform the binary determination. By the CAM shown in FIG. 19, a binary CAM of small occupation area and low power consumption can be realized.

FIG. 20 is a diagram showing comparison, in the form of a list, between the number of bits of the components of the content addressable memory of the present invention and the number of bits of the components of a conventional content addressable memory. FIG. 20 shows the number of components for each of the products between the numbers #N of entries and the numbers of data bits (b: bits), that is, the number of data storage cells CEL0, the mask bit cells CEL1, the number of comparators (match detecting circuits) XOR, and the total number of components.

In the conventional technique, in each of the CAM cells, the cells CEL0 and CEL1 for storing a data bit and a mask bit are disposed. A comparator (XOR circuit) is disposed for each CAM cell. Therefore, the components of the number corresponding to the capacitance value of each CAM are necessary.

On the other hand, according to the present invention, the number of mask cells is the half of the number of cells storing data, and the comparator (XOR circuit) is provided commonly for all of the entries. Therefore, the number of the XOR circuits (comparators) is equal to the bit width of one entry. The total number of components can be largely reduced as compared with that in the conventional configuration. The number of components can be decreased to almost the half, so that the occupation area can be largely reduced.

The search lines extend up to the comparators (XOR circuits) but are not disposed for the plural entries. Therefore, the search line charge/discharge currents can be largely reduced. In the case of determining match/mismatch by using the match line, only one match line is provided for the plural entries, and match line charge/discharge currents can be also largely reduced. As a result, the CAM of low current consumption and small occupation area can be realized.

Figure 21:
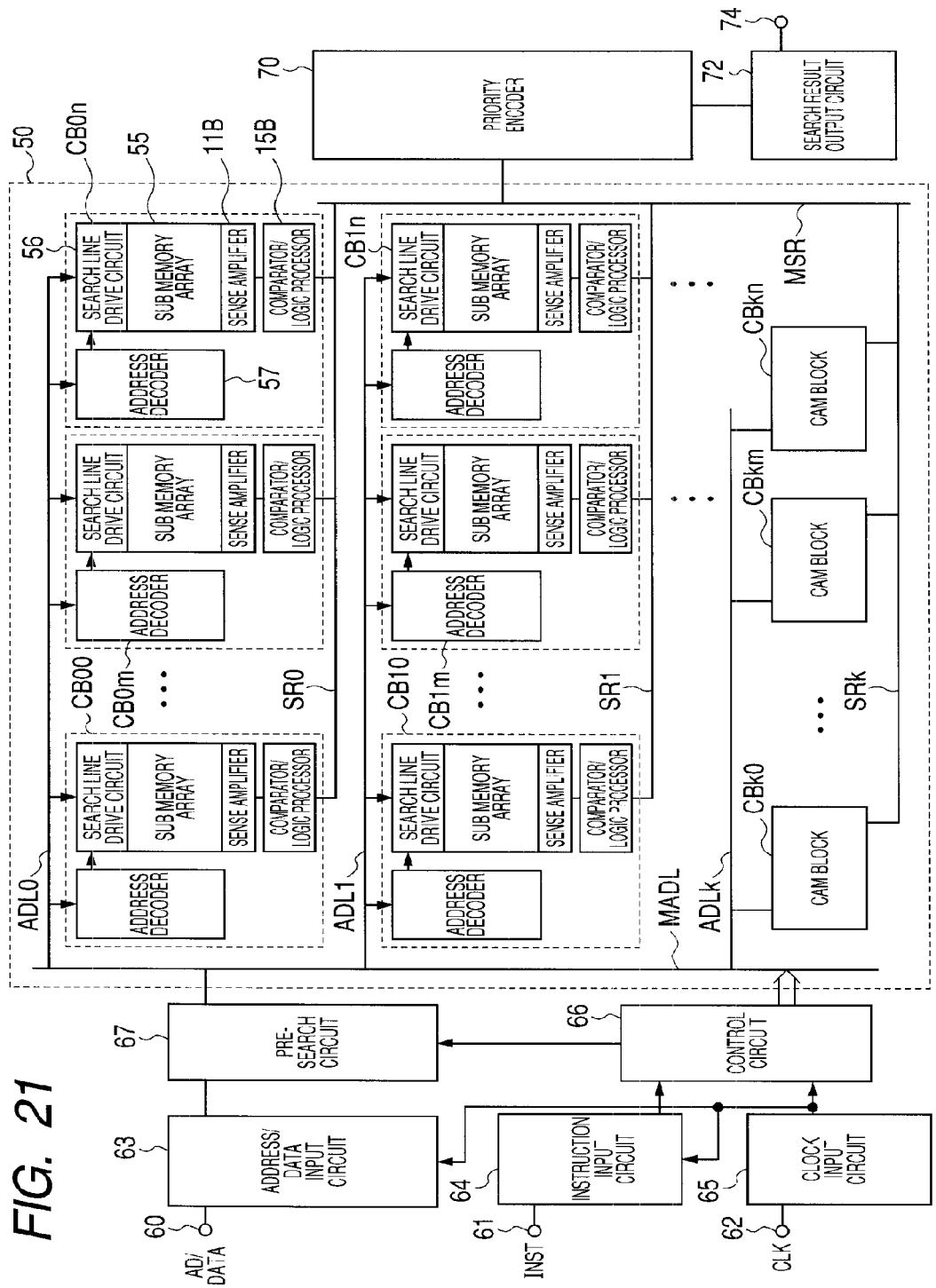
FIG. 21 is a diagram schematically showing a general configuration of the CAM as the first embodiment of the invention.

FIG. 21 is a diagram schematically showing a general configuration of the content addressable memory as the first embodiment of the present invention. In FIG. 21, a CAM array 50 is divided into plural CAM blocks CB00 to CB0n ... CBk0 to CBkn. Since the CAM blocks CB00 to CB0n ... CBk0 to CBkn have the same configuration, in FIG. 21, reference numerals are designated to the components of the CAM blocks CB0n.

The CAM block CB0n includes a sub-memory array 55 in which SRAM cells are arranged in a matrix, a search line drive circuit 56 for driving a search line in accordance with given data, and an address decoder 57 for selecting an entry in the sub-memory array 55 in accordance with the given address signal. The sub-memory array 55 corresponds to the memory array 1 shown in FIG. 1.

In the sub-memory array 55, word lines are disposed in correspondence with the entries, and the pairs of bit lines are disposed in correspondence with bits of the entries. The configuration is the same as that of the memory array 1 described with reference to FIG. 1. The sub-memory array 55 is provided with a sense amplifier circuit 11B and a comparing/logic processing circuit 15B. The sense amplifier circuit 11B detects and amplifies data stored in the data storage cells and the mask cells in the selected entry, and writes data to the selected memory cells in the corresponding sub-memory array 55 (a write circuit is not shown).

The configuration of the sense amplifier circuit 11B is also the same as that shown in FIG. 3. The comparing/logic processing circuit 15B includes a comparison circuit (XOR circuit) and a decoding circuit, and the configuration of the logic processing unit CLU included in the comparing/logic processing circuit 15B is the same as that shown in FIGS. 3 to 15.

The CAM block group is provided with local address/data lines ADL0 to ADLk. The local address/data lines ADL0 to ADLk are commonly coupled to a main address/data line MADL.

To the address/data lines ADL0 to ADLk, address signals and data (write data and search data) are transferred.

A local search result line SRi is commonly disposed for the CAM blocks CBi to CBin (i=0 to k) aligned in the lateral direction. To local search result lines SR0 to SRk disposed in correspondence with the CAM block rows, signals indicative of search results from the corresponding CAM blocks are transmitted in parallel. The local search result lines SR0 to SRk are coupled commonly to a main search result line MSR.

To perform data writing and searching operation, an address/data input circuit 63, an instruction input circuit 64, and a clock input circuit 65 are provided for the CAM array 50. The clock input circuit 65 generates an internal clock signal synchronously with a clock signal CLK from a clock terminal 62, and generates various signals that specify an internal operation cycle in the CAM. The address/data input circuit 63 fetches an address signal and data from an address/data input terminal 60 synchronously with a clock signal from the clock input circuit 65, and generates an internal address signal and data. The instruction input circuit 64 receives and decodes an instruction INST from an instruction input terminal 61 in accordance with an internal clock signal from the clock input circuit 65.

As shown in FIG. 21, in the CAM array 50, plural CAM blocks are provided, and the searching operation is performed in each of the CAM blocks. In this case, in the CAM blocks CB00 to CB0n to CBk0 to CBkn, one entry has to be selected from the sub-memory array 55. To select one entry in the sub-memory array, a pre-search circuit 67 is provided. At the time of writing data, the pre-search circuit 67 pre-decodes an address signal in accordance with an address signal from the address/data input circuit 63, and gives the pre-decode address signal to the CAM blocks CB00 to CBkn. A word line is selected in the selected CAM block (by the address decoder 57), and the data is written to a corresponding memory cell (data storage cells and mask cells).

In the searching operation, the pre-search circuit decodes predetermined data (hereinbelow, called characteristic data) included in packet data from the address/data input circuit 63, and generates a signal for designating an entry corresponding to the characteristic data detected by the pre-search to the CAM blocks CB00 to CB0n to the CAM blocks CBk0 to CBkn.

To control the internal operation of the CAM, a control circuit 66 is provided. The control circuit 66 controls the internal operations of the pre-search circuit 67 and the CAM array 50 in accordance with the internal clock signal from the clock input circuit 65 and the operation mode instruction from the instruction input circuit 64. By the control circuit 66, various control signals such as the sense amplifier enable signal SAEN are generated.

The CAM further includes a priority encoder 70 and a search result output circuit 72 for receiving an output signal of the priority encoder 70. In the case where the same determination process signal (match or size-relation determination result instruction signal) is output from the plural CAM blocks in the CAM blocks CB00 to CB0n to the CAM blocks CBk0 to CBkn, the priority encoder 70 selects a search result of an entry of the CAM block of the highest priority (for example, an entry of the Cam block of a small address), and generates an entry address index indicative of the address of the entry of the selected CAM block. The search result output circuit 72 receives an address index output from the priority encoder 70 and outputs it from a search result output terminal 74.

According to the address index from the search result output terminal 74 or the like, a process of reading the next hop destination address or permitting/denying transfer of a corresponding packet is executed.

In this case, the search result output circuit 72 may receive a CAM block address indicative of an entry of the highest priority from the priority encoder 70 together with characteristic data, and output an index corresponding to the combination of the address and the characteristic data. For example, the search result output circuit 72 is constructed by a memory, and corresponding data is output according to an entry instruction address (combination of a CAM address and the characteristic data) from the priority encoder 70.

By using the pre-search circuit 67, in the searching operation, one entry is selected in advance in the CAM block CB (generically showing the CAM blocks CB00 to CB0n to CAM blocks CBk0 to CBkn). Consequently, plural entries can be prevented from being selected simultaneously in each of the CAM blocks CB, and the searching operation can be performed reliably. In the following, pre-search of the pre-search circuit 67 in the searching operation will be described.

In the use of the Internet of a router, a fabric switch, or the like, the search data is an IP address. In an LAN (Local Area Network), a private IP address is assigned to a process terminal in the network. The private IP address is usually classified by characteristic called class.

Figure 22:
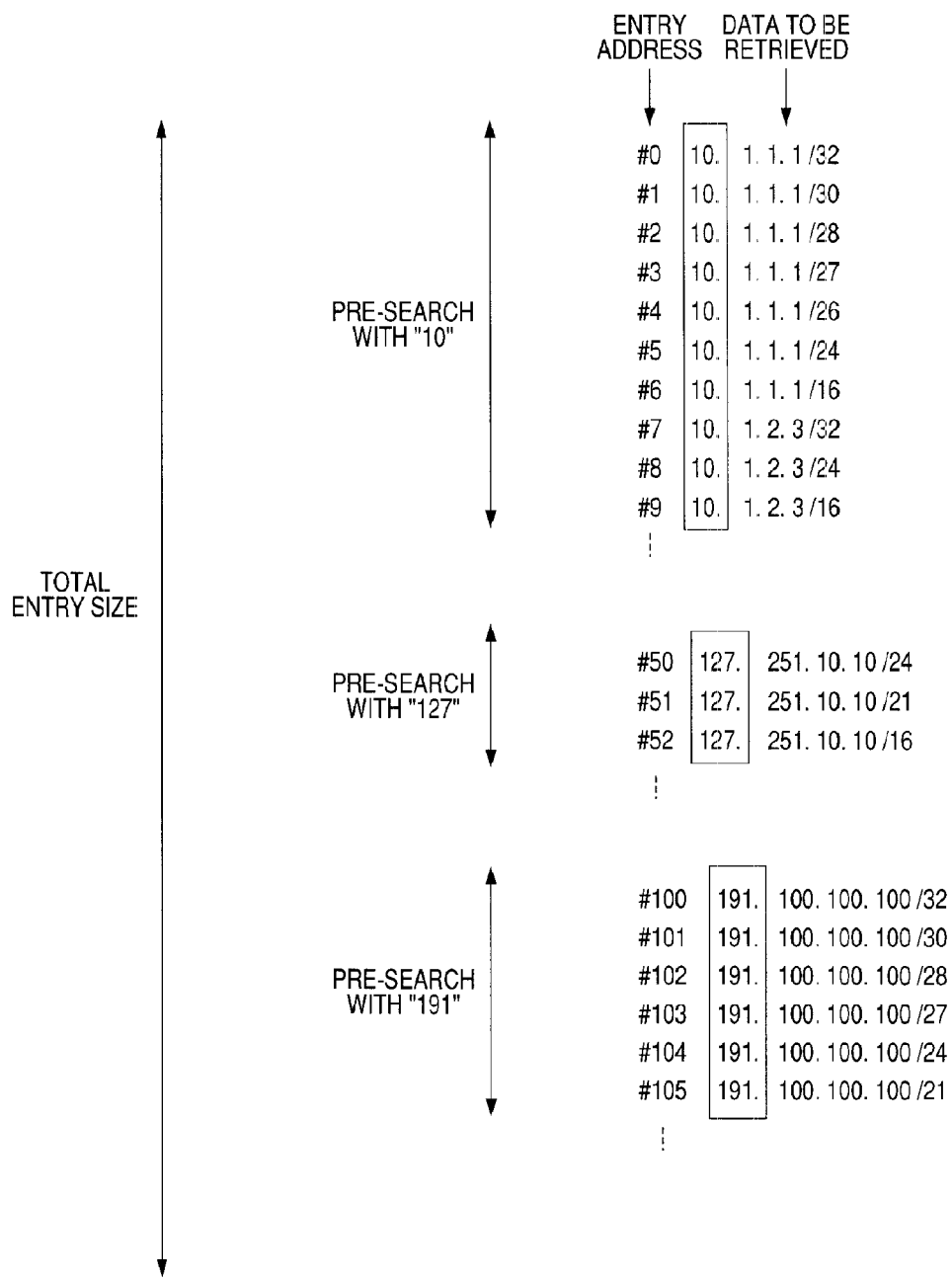
FIG. 22 is a diagram for explaining pre-search process of a pre-search circuit shown in FIG. 21.

FIG. 22 is a diagram showing a list of IP addresses to be retrieved by the search data, that is, storage data of entries disposed in a CAM block. In FIG. 22, in order from the entry address #0, 32-bit IP addresses of data to be retrieved are stored. The IP address is divided in decimal with periods on the octet unit basis. An effective bit length is written after "/". The class is defined by the number of the first octet, and the length of a network address and the length of a host address are defined by the class.

As shown in FIG. 22, in entry addresses #0 to #9, the value of the first octet is "10". In entry addresses #50 to #52 and after that, the value of the first octet is "127". Further, in the entry address #100 or later, the value of the first octet is "191". Therefore, the class is classified to, for example, classes A to C according to the values of the first octet.

In the list shown in FIG. 22, the same prefix data "10.1.1.1" is written in the entry addresses #0 to #6. In the entry addresses #0 to #6, the effective bit length varies. Data having long effective length (indicated by the number after "/") is written in a small address position. Data having short effective length is written in a large address position. The rule of writing an IP address to an entry relates to arrangement of prefix data in consideration of a longest match search. For example, when data "10.1.1.1" is input as search data, a match in all of the TCAM entry addresses #0 to #6 is detected, and a multiple hit state is resulted. In this case, according to the longest match retrieval rule, prefix data having the longest effective length is output. Consequently, by the priority encoder 70 (refer to FIG. 21), an entry address of the smallest value in addresses of matched entries is selected. As a result, match data having the longest effective length can be retrieved, and the entry address #0 can be obtained as a desired final search result.

In the case where the search data is "10.1.1.2", match is detected in the entry addresses #1 to #6. In this case, therefore, the entry address #1 is output as the final search result.

As shown in FIG. 22, in an IP address, the characteristic data indicative of the address classification is arranged in the first octet. In the example shown in FIG. 22, the first octet is "10 (in decimal)" in all of the entry addresses #0 to #9. Similarly, the first octet is "127 (in decimal)" in all of the entry addresses #50 to #52. The first octet is "191 (in decimal)" in all of the entry addresses #100 to #105. Grouping of data to be retrieved by using the characteristic data (for example, the data in the first octet in FIG. 22) in prefix data will be called pre-search. Prior to search the entire prefix data, the number of entries to be actually retrieved is reduced (to, for example, 1/32) by using the characteristic data (for example, the first octet data), and a search in a partial area in the CAM array 50 is executed.

The invention is not limited to the case of pre-searching the first octet in an IP address as search data. In the case where data to be retrieved can be grouped by using characteristic data, it is sufficient to group the data in accordance with the characteristic data. For example, in FIG. 22, the second octet in the entry addresses #0 to #9 is "1 (in decimal)", the second octet in the entry addresses #50 to #52 is "251 (in decimal)", and the second octet in the entry addresses #100 to #105 is "100 (in decimal)". Therefore, the data to be retrieved may be grouped on the basis of the second octet, and pre-search may be performed by using the value of the second octet. In the following, the case of grouping using the first octet will be described.

Figure 23:
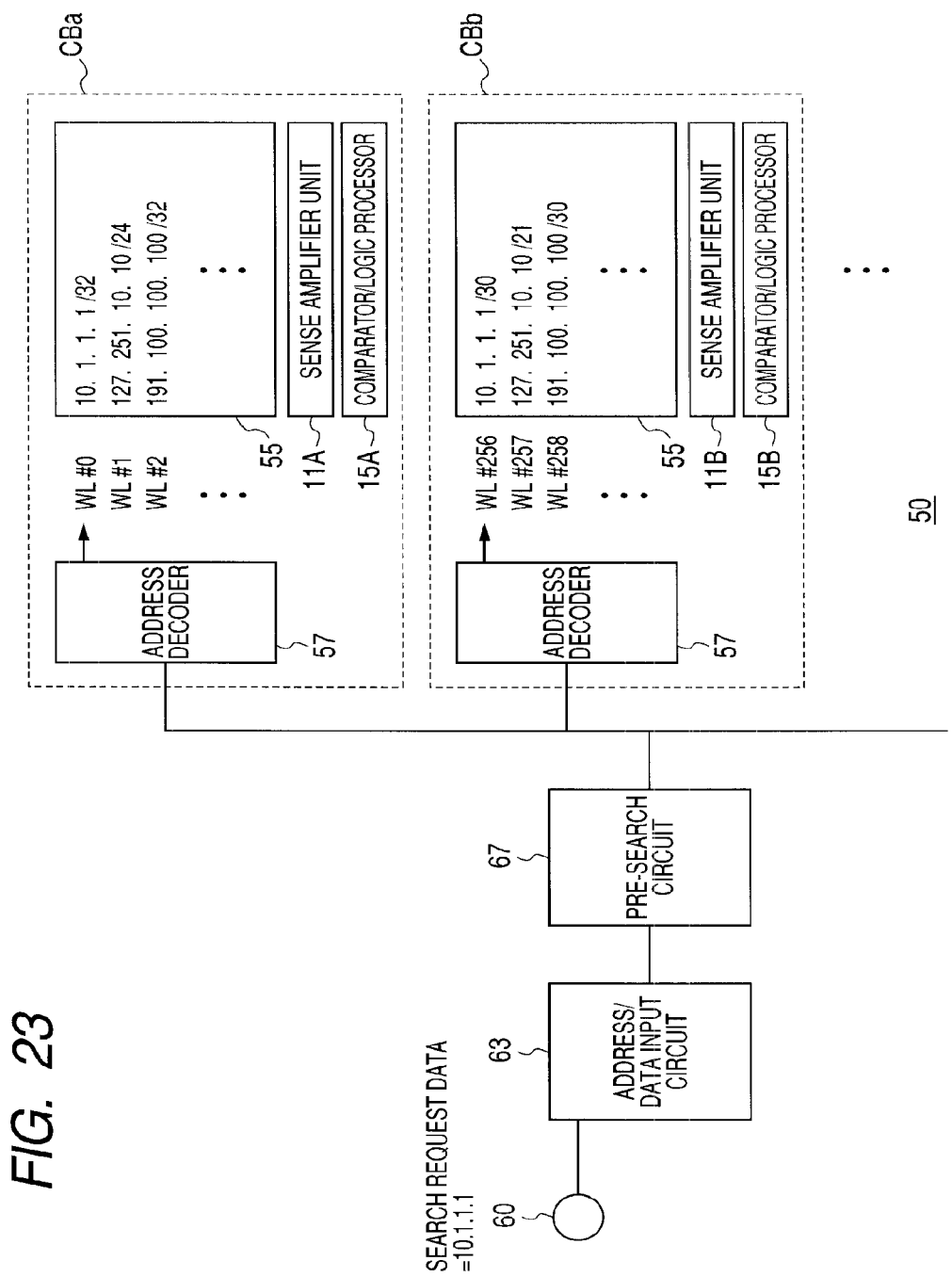
FIG. 23 is a diagram showing an example of arrangement of data to be retrieved by the pre-search process into CAM blocks.

FIG. 23 is a diagram schematically showing arrangement in a CAM block of data to be retrieved in the CAM blocks in the CAM array 50. In FIG. 23, as CAM blocks, CAM blocks CBa and CBb are representatively shown. The sub-arrays 55 in the CAM blocks CBa and CBb have the same characteristic data (first octet data), and stores data (IP addresses) of different effective prefix lengths. Therefore, for example, with respect to data whose first octet is "10 (in decimal)", data "10.1.1.1/32" is stored in the word line address WL#0 of the CAM block CBa. Data "10.1.1.1/30" is stored in the word address WL#256 of the CAM block CBb. The same word line address is assigned to the word lines WL#0 and WL#256. When search data whose first octet data as the characteristic data is "10 (in decimal)" is given to the pre-search circuit 67, a corresponding word line address is generated. According to the word line address generated by the pre-search, the word lines WL#0 and WL#256 are driven to a selection state in the CAM blocks CBa and CBb, and the comparing and logic process is executed. Priority order of effective prefix length is set to the CAM blocks CBa and CBb. According to a match detection signal from the CAM block of the smallest value of the block address designating the CAM block, an address index corresponding to the match retrieval result can be generated by the priority encoder 70 (by combining pre-searched characteristic data, a match retrieval entry can be identified).

In the case where the number of kinds of characteristic data is larger than the number of word lines in the CAM blocks CBa and CBb, the data is expanded to another CAM block. In the case where search data whose characteristic data (first octet data) is "10 (in decimal)" is given in the CAM blocks CBk0 to CBkn in the CAM blocks CB00 to CB0n shown in FIG. 21, one entry is selected in the CAM block CB in accordance with a generated word line address. In an internal local part, a retrieving operation of determining match/mismatch is in the CAM block is executed. In this case, in a CAM block storing only data to be retrieved which does not include the characteristic data, the retrieving operation is not executed. In this case, power consumption is further reduced.

For example, in FIG. 23, when the search data "10.1.1.1" is given from the address/data input circuit 63 to the pre-search circuit 67, the precharge circuit extracts the first octet data "10" as the characteristic data and decodes it. In this case, a correspondence table of characteristic data and word line addresses is prepared in the pre-search circuit 67. With reference to the table, a word line address is generated (a CAM block designation signal may be included). By decoding, a common word line address designating the word lines WL#0 and WL#256 is generated (for example, the local word line address in the CAM block is "0") and is given to the address decoders 57 in the CAM blocks CBa and CBb. When the characteristic data is stored in a small number of CAM blocks in the plural CAM blocks, in the pre-search circuit 67, a block address for specifying the CAM blocks (or a block selection signal for enabling the CAM blocks) is generated together with the word line address in accordance with the characteristic data (first octet data).

As the pre-search circuit 67, it is sufficient to simply use a decoding circuit for extracting and decoding first octet data in an IP address included in the header of packet data which is input synchronously with a clock signal. Alternatively, data indicative of correspondence between characteristic data and a word line address/CAM block designation address may be stored in a register file and read according to characteristic data.

Therefore, for example, in the case where the word lines WL#0 and WL#256 are selected, the CAM blocks CBa an CBb perform match determination on the search request data and generate a match instruction signal. When the data matches, the block address of the CAM block CBa is smaller than that of the CAM block CBb, priority is given to the match detection of the CAM block CBa. According to the characteristic data and the block address specifying the CAM block, the position of the selected entry in all of the entries is designated, and an address index used to show the next destination of forwarding is generated by the priority encoder.

By using the characteristic data (first octet data) extracted by the pre-search circuit 67 as described above, also at the time of multiple hits, the matched entry address is identified, and an address index for detecting the next hop destination address can be generated.

In the TCAM, it is requested to dispose data to be retrieved so as to be spread in the CAM blocks in accordance with the characteristic data. That is, different from a conventional CAM, in the CAM of the present invention, the sense amplifier circuit is provided commonly for plural entries. In the case of selecting two or more entries simultaneously, read data of memory cells disappears and accurate search cannot be performed. Maintenance of writing of data to be retrieved, which is stored in the CAM array will now be described.

Figure 24:
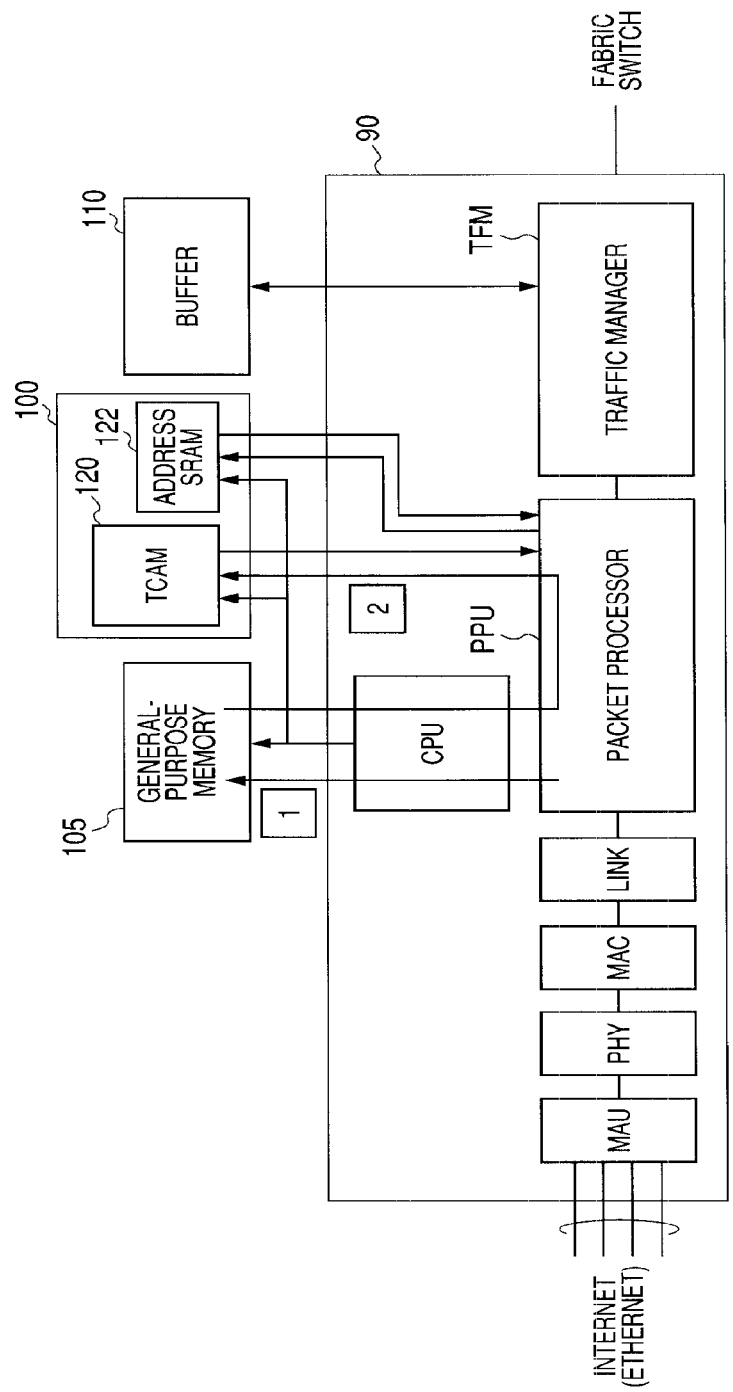
FIG. 24 is a diagram schematically showing a general configuration of a packet processing unit using the TCAM of the present invention.

FIG. 24 is a diagram schematically showing the configuration of an entire packet processing unit in network equipment using the TCAM of the present invention. In FIG. 24, a packet processing unit 90 includes a media access unit MAU coupled to a transmission path of the Internet (for example, Ethernet), and a physical layer unit PHY, a media access control unit MAC, and a link layer unit LINK which are disposed according to protocol layers.

The media access unit MAU has an interface function for the transmission path of the Internet. The physical layer unit PHY is a physical coupling part to the Internet and converts a light signal from the media access unit MAU to an electric signal. The media access control unit MAC performs a process specified in a second layer and executes formatting and transfer of data in accordance with a predetermined protocol (such as TCP/UDP). The link layer unit LINK is an interface of data transfer between the media access control unit and a packet processor PPU. The packet processor PPU analyzes the header of a packet transferred via the Internet, extracts data, and detects the address of the next destination.

The packet processing unit 90 further includes a central processing unit CPU, and a traffic manager TFM for controlling congestion in data transfer in the Internet. The central processing unit CPU operates in cooperation with the packet processor PPU and executes necessary control and external control.

On the outside of the packet processing unit 90, a search unit 100, a general memory 105, and a buffer 110 are provided. The buffer 110 is used as a temporary packet storage area for avoiding congestion in the data transfer by the traffic manager TFM. The search unit 100 has therein a TCAM 120 constructed by the CAM of the present invention and an address SRAM 122 for storing the next hop destination address or the like. The search unit 100 receives, as search data, the IP address from the packet processor PPU, executes a process such as match/mismatch or size determination, and transfers the execution process result to the packet processor PPU. For example, in the case of an address path retrieving process, the packet processor PPU accesses the address SRAM 122 in accordance with the transferred retrieval result, and reads out data in a corresponding address, for example, the next destination address. The packet processor PPU executes a process such as header rewriting in accordance with the read next destination address, and transfers the resultant data to a corresponding port of the fabric switch.

In this case, in the search unit 100, the address index from the TCAM 120 may be directly given as an address to the SRAM 122. A corresponding transfer destination address (next hop address) may be read from the address SRAM 122 and transferred to the packet processor PPU.

At the time of writing data to be retrieved to the TCAM 120 included in the search unit 100, in cooperation with the packet processor PPU, the central processing unit CPU temporarily stores the data to be retrieved into the general memory 105 and, after that, writes/updates the data to be retrieved to the sub array in the TCAM 120 included in the search unit 100.

Figure 25:
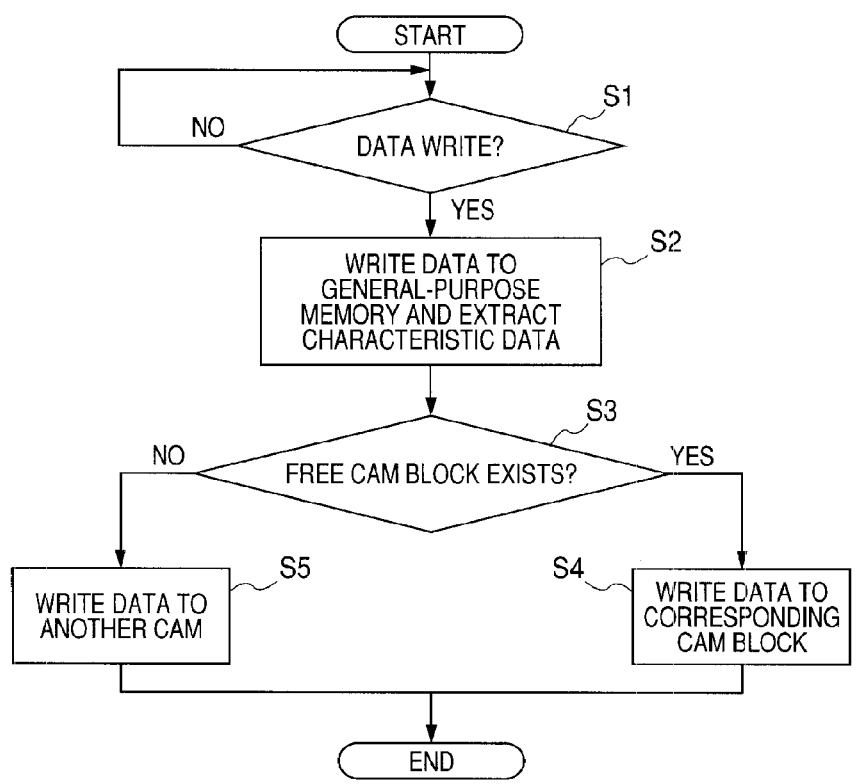
FIG. 25 is a flowchart showing a sequence of rewriting data to be retrieved by a TCAM in the packet processing unit of FIG. 24.

FIG. 25 is a flowchart showing operation of writing data to be retrieved onto the TCAM 120 included in the search unit 100. In the following, with reference to FIG. 25, the operation of writing the data to be retrieved to the TCAM 120 in the search unit 100 shown in FIG. 24 will be described.

When, for example, a mismatch detection signal is received from the search unit 100, the packet processor PPU determines that corresponding data to be retrieved is not stored in the search unit 100 and it is necessary to write new data to be retrieved, and issues a data write instruction to the central processing unit CPU (step S1).

The packet processor PPU stores target data (for example, the IP address) of a data packet given via the link layer unit LINK, that is, search data into the general memory 105 via the central processing unit CPU. Subsequently, the central processing unit CPU extracts data stored in the general memory 105, for example, first octet data (step S2).

A check is made to see whether the data to be retrieved having the extracted characteristic data (for example, first octet data) is stored in a CAM block in the TCAM 120 included in the search unit 100 or not (step S3). In this case, a flag register is provided in the central processing unit CPU. In the flag register, flags each indicating whether the characteristic data in data to be retrieved is stored or not are stored in correspondence with the CAM blocks in the TCAM 120 in the central processing unit CPU. At the time of the determination, by referring to the flag register, the central processing unit CPU can determine whether target data can be written in a CAM block in the TCAM 120 or not.

In the case where a CAM block which is not multiple-selected, that is, a cam block in which data to be retrieved having corresponding characteristic data is not stored exists, the central processing unit CPU writes data to be retrieved which is stored in the general memory 105 into the CAM block. At the time of writing, when an effective length exists such as an IP address in the data to be retrieved, mask data is generated according to the effective length, and the generated data is written. By executing encoding opposite to the decoding of the logic processing unit, mask data is generated (step S4). According to new data to be retrieved, a corresponding next hop destination address is written also to the address SRAM 122 (by the central processing unit CPU).

On the other hand, when the data to be retrieved is written and no free CAM block exists, the data to be retrieved is stored as entry data into another normal CAM prepared (step S5).

By the series of processes, even if a search error occurs in future in which one entry is selected in one CAM block, corresponding data is stored in the TCAM 120 by the next search, so that searching operation can be executed at high speed.

Modification of Search Unit

Figure 26:
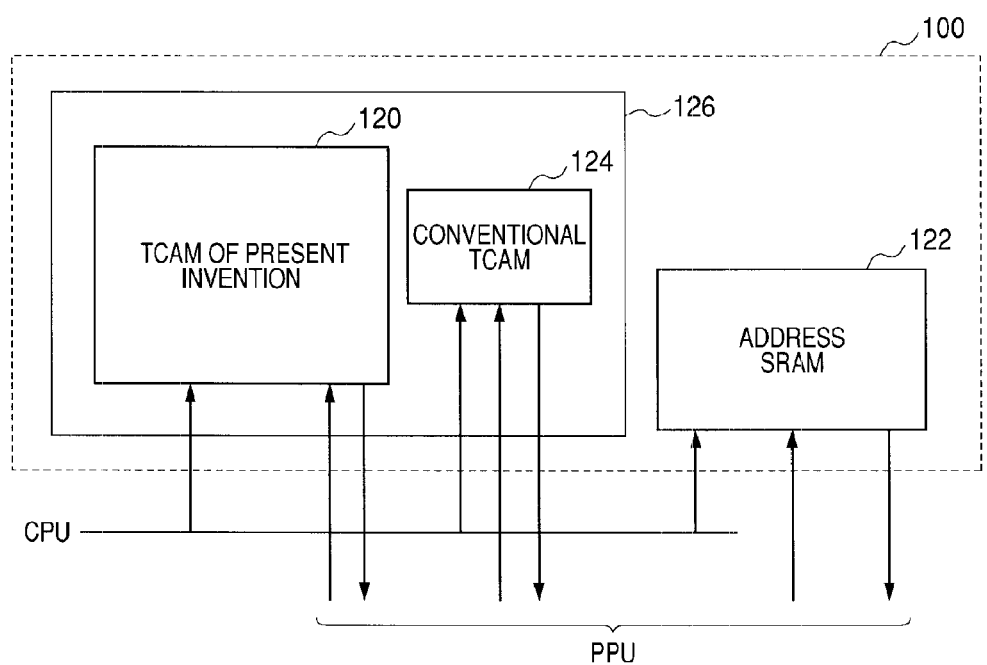
FIG. 26 is a diagram schematically showing the configuration of a modification of the TCAM illustrated in FIG. 24.

FIG. 26 is a diagram schematically showing the configuration of a modification of the search unit 100 illustrated in FIG. 24. In FIG. 26, the TCAM 120 of the present invention and a conventional TCAM 124 are provided as a TCAM 126. On the outside of the TCAM 126, in a manner similar to the configuration of FIG. 24, an address SRAM 122 is provided.

In the TCAM 120 of the present invention, for example, in the use of an ACL, the range of an IP address cannot be detected. There is also the possibility that plural entries are selected in parallel in a single CAM block. In this case, competing IP addresses are stored in the conventional TCAM 124 having the conventional configuration. In the conventional TCAM 124, data storage cells for storing data and mask cells for storing mask bits are disposed in a one-to-one correspondence manner, and one XOR circuit is disposed for the pair of the mask cell and the data storage cell. The conventional TCAM 124 corresponds to another CAM in step S5 of the flowchart shown in FIG. 25.

In the TCAM 120 of the present invention, in the configuration in which the comparing/logic processing circuit is provided commonly for plural entries, the possibility that two or more entries are selected in parallel can be avoided by using the conventional TCAM 124. In this case, the number of addresses to be retrieved is small, so that the small capacity of the conventional TCAM 124 is sufficient.

In the case of detecting whether search data exists in a certain range or not, a range in an entry can be designated by setting a mask bit in data to be retrieved. By executing a "greater than" determination and a "smaller than" determination in parallel and performing identification using different priority encoders, the range of the search data can be detected.

In the TCAM 126, the retrieving operation in the TCAM 120 of the present invention is performed. Also in the conventional TCAM 124, the retrieving operation is executed. In the use of the ACL control, basically, a packet discarding process is performed by a combination of the IP address of a transmitter and a TCP port number or the like. In this case, therefore, data transferred by the media access control unit MAC is made of 48 bits, the IP address is made of 32 bits, and the port number is made of 16 bits. According to the characteristic data in the IP address (the IP address on the source side), entries are classified. In the access control using the ACL, there is a case that, depending on whether the IP address (information of the layer 3) matches or not, an access is permitted or denied. According to match/mismatch of the port number (information of the layer 4) and the IP address, permission/denial of an access may be regulated. In the case where an access is denied, the corresponding packet is denied by a so-called fire wall function of the access control list. As a result, also in the case where plural entries are selected in parallel in the TCAM 120 of the present invention and the conventional TCAM 124, an unnecessary access can be controlled reliably.

As described above, according to the first embodiment of the present invention, the comparing/logic processing circuit is provided commonly for plural entries, and one entry is selected by a pre-search. Therefore, it is unnecessary to dispose the comparing/logic processing circuit such as an XOR circuit in each of the plural entries. The occupation area of the CAM cells can be reduced, and the occupation area of the CAM array can be reduced. In addition, by decoding a mask bit, a mask instruction signal for each memory cell is generated. Consequently, the number of mask cells storing mask bits is reduced and, further, the area of the memory array is reduced.

The determinations of match/mismatch, size relation determination, and the like are locally performed by the comparing/logic process circuit provided commonly for the plural entries. Therefore, it is unnecessary to determine the match/mismatch and the size relation in each of the entries, and consumption current is reduced. In addition, it is unnecessary to dispose a search line commonly for entries and transmit the search data commonly to the entries in parallel. Thus, search line charge/discharge current is reduced.

Second Embodiment

Figure 27:
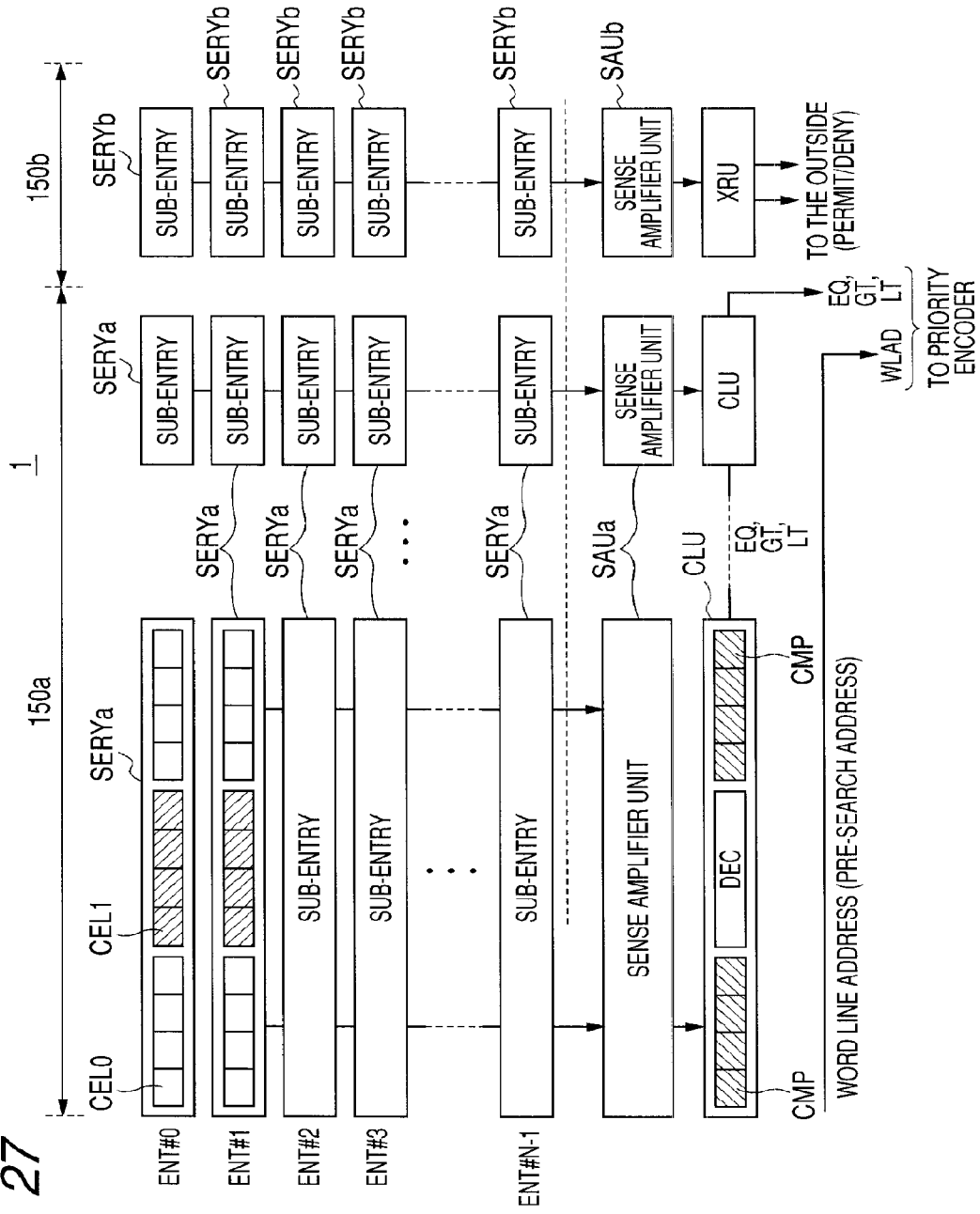
FIG. 27 is a diagram schematically showing the configuration of a main part of a CAM as a second embodiment of the present invention.

FIG. 27 is a diagram schematically showing the configuration of a main part of a CAM as a second embodiment of the present invention. In FIG. 27, a memory array 1 is divided into two regions 150*a* and 150*b*. In the region 150*a*, in a manner similar to the first embodiment, each of entries ENT#0 to ENT#N−1 is divided into plural sub-entries SERYa. In the sub-entry SERYa, data storage cells CEL0 and mask cells CEL1 are disposed. The number of mask cells CEL1 is smaller than the number of data storage cells CEL0. A sense amplifier unit SAU is disposed in correspondence with a sub-entry in the region 150*a*. In the sense amplifier unit SAU, like the configuration of the first embodiment, a bit line read selection gate and a sense amplifier are disposed in correspondence with each of the data storage cells. In the region 150*a*, further, a comparing/logic processing unit CLU is disposed in correspondence with the sense amplifier unit SAU. In a manner similar to the first embodiment, the comparing/logic processing unit CLU includes a comparator CMP disposed in correspondence with the data storage cells, and a decoder DEC disposed in correspondence with the mask cells. The comparator CMP includes an XOR circuit and a size comparing unit.

From the comparing/logic processing unit CLU in the region 150*a*, a match instruction signal (flag) EQ, a large instruction signal (flag) GT, and a small instruction signal (flag) LT are supplied together with a corresponding word line address (address obtained by pre-search) WLAD to a priority encoder. In this case, a CAM block address may be also supplied.

In the priority encoder, in the case where an object to be retrieved is affirmed in accordance with the computing process operation, an address index used by the following process is generated in accordance with the word line address WLAD (and the CAM block address). The address index is supplied to the address SRAM or the like shown in FIG. 24, data corresponding to the address index is read, and the following process is executed. For example, in the Internet equipment, the next hop destination address is read (from the address SRAM), and rewriting of the header or the like is executed (in the packet processing unit).

On the other hand, in the region 150*b*, sub-entries SERYb each having a bit width different from that of the sub-entry SERYa are disposed in correspondence with the entries ENT#0 to ENT#N−1. The bit width of the sub-entry SERYb is, for example, 16 bits. The sense amplifier unit SAU is disposed in correspondence with the sub-entry SERYb, and the match detecting unit XRU is provided in correspondence with the sense amplifier unit SAUb in the region 150*b*.

Also in the sub-entry SERYb, like the sub-entry SERYa, the data storage cells and the mask cells are disposed, and the number of mask bits of the mask cells is smaller than that of the data storage cells. The configuration of the sense amplifier unit SAUb is the same as that of the sense amplifier unit SAUa. The XOR unit XRU is provided with a match detecting circuit for detecting match/mismatch between data stored in the data storage cell from the selected corresponding sub-entry SERYb and search data from a not-shown search line. A decoder for decoding a mask bit from a mask cell included in the sub-entry SERYb is disposed, and the XOR unit XRU executes ternary determination in accordance with a mask instruction signal from the decoder. A result of the ternary determination from the XOR unit XRU is simply used as a signal indicative of match/mismatch, and used as a flag indicative of permission/denial of an address access from the outside.

As shown in FIG. 27, the memory array 1 is divided into the region 150a for outputting an address index and storing data requiring complicated operation later, and the region 150b for storing data for setting a flag simply indicating denial/permission of an access. By providing the region 150a for forming an address index and the region 150b for simply setting the permit/deny flag in the CAM, for a use of simply detecting permission/denial of an access, it is unnecessary to provide a priority encoder and to dispose an SRAM for storing the next operation according to an address index. Thus, the layout area is reduced.

In the CAM array, plural memory arrays 1 may be disposed in parallel so as to construct plural CAM blocks as shown in FIG. 21. In the case where plural CAM blocks are provided, a block address for specifying a CAM block in cooperation with a word line address is supplied together with the flags EQ, GT, and LT from the region 150a to the priority encoder 70. In the priority encoder, a word line address from the CAM block of the smallest block address is selected as an address index.

FIG. 28 is a diagram schematically showing a general configuration of the CAM as the second embodiment of the invention. In FIG. 28, a CAM 200 as the second embodiment of the invention includes two CAM arrays 50A and 50B. The CAM array 50A is divided into CAM array regions 50Aa and 50Ab. The CAM array 50B is divided into CAM array regions 50Ba and 50Bb. The configuration of the CAM arrays 50A and 50B is the same as that of the CAM array shown in FIG. 27.

Search line drive circuits 56Aa and 56Ab are provided in correspondence with the CAM array regions 50Aa and 50Ab, respectively and receive search data "a" and "b" in parallel. Comparing/logic processing circuits 15Aa and 15Ab are provided in correspondence with the CAM array regions 50Aa and 50Ab, respectively. Therefore, in the CAM array regions 50Aa and 50Ab, the address of an entry to be processed, that is, the word line address WLAD (and a block address) is transmitted together with search requests EQ, GT, and LT on data to be retrieved onto a search result bus 210. The configuration of the comparing/logic processing circuits 15Aa and 15Ab is the same as that of the comparing/logic processing circuit shown in the foregoing first embodiment. Each of the comparing/logic processing circuits 15Aa and 15Ab includes a comparing/logic processing unit (CLU) disposed in correspondence with a sub-entry.

Also in the CAM array 50B, similarly, search line drive circuits 56Ba and 56Bb are provided for the two CAM array regions 50Ba and 50Bb, respectively. The search data "a" for detecting the size relation (">") is supplied to the search line drive circuit 56Ba. The search data "b" for detecting whether an access is denied or not is supplied to the search line drive circuit 56Bb.

For the CAM array region 50Ba, a comparing/logic processing circuit 15B is provided. On the other hand, for the CAM array region 50Bb, the XOR unit XRU is disposed.

Therefore, on data to be retrieved which is stored in the CAM array region 50Ba, in a manner similar to the CAM array 50A, computing processes such as match and size comparison are executed. On the other hand, in the CAM array 50Bb, a flag indicative of permission/denial according to match/mismatch is output. Therefore, output signals EQ, GT, and LT of the comparing/logic processing circuit 15B are transmitted together with the corresponding word line address WLAD (including the block address) onto the search result data bus 212. On the other hand, a flag NEQ/EQ indicative of a mismatch/match result from the XOR unit XRU is transmitted onto a search result line 214. The data buses 210 and 212 are coupled to a main search result bus 216. To the main search result bus 216, the word line address WLAD (including the block address) is supplied together with the flags EQ, GT, and LT indicative of search results in the CAM array 50A. From the CAM array 50B, the flags EQ, GT, and LT from the comparing/logic processing circuit 15B are supplied together with the corresponding word line address WLAD (including the block address) in parallel.

The priority encoder 70 selects a corresponding word line address (including the block address) as an address index in accordance with predetermined priority on the basis of the flags from the search result buses 210 and 212. In the case where each of the CAM array regions 50Aa, 50Ab, and 50Ba is divided into plural CAM blocks, the block address specifying a CAM block is supplied to the priority encoder 70. The priority by the block address is identified, and a corresponding word line address is selected as an address index.

An output signal of the priority encoder 70 and the flag NEQ/EQ from the XOR unit XRU of the CAM array 50B are supplied to the search result output circuit 72. The search result output circuit 72 includes a multiplexer, selects one of the output signal of the priority encoder 70 and the flag NEQ/EQ from the XOR unit XRU in accordance with a mode selection signal MODSEL, and transmits the selected one to the search result output terminal 74.

The mode selection signal MODSEL is generated by a control circuit (the control circuit 66 shown in FIG. 21) in accordance with an instruction from the outside. In an operation mode of determining permission/denial as in the use of ACL control, the search result output circuit 72 selects the instruction flag NEQ/EQ from the XOR unit XRU by the multiplexer, and outputs it to the search result output terminal 74. Like an IP address forwarding process, when the match determination or size-relation determination is designated by the mode selection signal MDSEL, the search result output circuit 72 selects output data of the priority encoder 70 by the multiplexer and transfers it to the output terminal 74.

To the priority encoder 70, addresses and search results specifying the CAM array regions 50Aa, 50Ab, and 50Ba may be supplied together with a determination mode selection signal indicative of a process. It is also possible to select a search result from a CAM array region in accordance with the determination mode and select a word line address in the corresponding determination mode in accordance with predetermined priority. A final determination result may be generated for each of the processes (match and size-relation determination) in accordance with the priority in parallel with the match and the size-relation.

The bit width of the CAM array regions 50Ab and 50Bb for determining the match/mismatch is, for example, 16 bits which is smaller than the bit width of the CAM array region 50Aa and 50Ba (the bit width of the entry) having a width of 32 bits. Therefore, without enlarging the area of the CAM array, plural kinds of computing processes can be executed.

As described above, in the second embodiment of the present invention, the memory array region is divided according to a computing process. Therefore, a single CAM array is flexibly adapted to a use of the ACL control or the like requiring a simple operation of outputting only a flag without necessity of outputting an address index, and to a use of performing an IP address forwarding process. In addition, effects similar to those of the first embodiment are also produced.

In the above, a CAM in network equipment using an IP address as data to be retrieved has been described. Also with respect to IPv4 (Internet/protocol version 4) and IPv6, similarly, when address characteristic data for classification exists, an IP address can be applied in parallel.

The data to be retrieved is not limited to the IP address. Also in another operation such as size comparison, when input data (search data) is classified according to characteristic data, the CAM of the present invention can be similarly applied.

What is claimed is:

1. A network equipment comprising:
    a central processing unit,
    a packet processing unit, which receives data from the Ethernet, and
    a content addressable memory,
    wherein the central processing unit controls to transfer data from the packet processing unit to the content addressable memory,
    wherein the packet processing unit performs analyzing a header of a packet, extracting data, and detecting an address of a next destination, and
    wherein the content addressable memory analyzes an address received from the packet processing unit, and comprises:
    a memory array including a plurality of memory cells arranged in a matrix and each memory cell row of the memory array storing entry data to be retrieved;
    an entry selecting unit for selecting a corresponding entry in the memory array in accordance with a given entry designation signal;
    a pre-search unit for generating an entry designation signal for designating a corresponding entry in the memory array in accordance with search data and supplying the entry designation signal to the entry selecting unit;
    a plurality of sense amplifiers for detecting and amplifying data stored in an entry selected by the entry selecting unit on a sub-entry unit basis, each sense amplifier being arranged for a respective column of the memory array; and
    a comparing/logic processing unit for receiving the search data and output data having a predetermined bit width of the sense amplifiers, comparing the search data and the output data having the predetermined bit width of the sense amplifiers, and generating a signal indicative of a result of the comparison.

2. A network equipment according to claim 1,
    wherein the comparing/logic processing circuit includes:
    a plurality of match determining circuits for determining a match between output data of the sense amplifiers and the search data, each match determining circuit being arranged for a respective column of said memory array; and
    a size comparing circuit for generating a signal indicative of size relation between the output data of the sense amplifiers and the search data.

3. A network equipment according to claim 2,
    wherein the size comparing circuit performs the size relation determination in accordance with an output signal of the match determining circuits.

4. A network equipment according to claim 3,
    wherein the content addressable memory further comprises a mask decoding circuit for decoding data stored in mask cells in the entry selected by the entry selecting unit and supplying a mask instruction signal indicative of a result of the decoding to a corresponding match determining circuit.

* * * * *